(12) United States Patent
Kim

(10) Patent No.: US 11,670,359 B2
(45) Date of Patent: *Jun. 6, 2023

(54) SEMICONDUCTOR MEMORY DEVICE CAPABLE OF OPERATING AT HIGH SPEED, LOW POWER ENVIRONMENT BY OPTIMIZING LATENCY OF READ COMMAND AND WRITE COMMAND DEPENDING ON VARIOUS OPERATION MODES

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/824,470

(22) Filed: May 25, 2022

(65) Prior Publication Data
US 2022/0284943 A1 Sep. 8, 2022

Related U.S. Application Data

(62) Division of application No. 17/097,151, filed on Nov. 13, 2020, now Pat. No. 11,404,104.

(30) Foreign Application Priority Data

Jun. 24, 2020 (KR) .......................... 10-2020-0077046

(51) Int. Cl.
G11C 7/22 (2006.01)
G11C 11/4076 (2006.01)
(Continued)

(52) U.S. Cl.
CPC ...... *G11C 11/4076* (2013.01); *G11C 11/4082* (2013.01); *G11C 11/4087* (2013.01); *G11C 11/4096* (2013.01)

(58) Field of Classification Search
CPC ............ G11C 11/4076; G11C 11/4082; G11C 11/4087; G11C 11/4096
See application file for complete search history.

(56) References Cited

U.S. PATENT DOCUMENTS 10,372,330 B1 * 8/2019 Gans .................... G11C 11/4093
2001/0039602 A1 * 11/2001 Kanda .................... G11C 7/222
711/167

(Continued)

*Primary Examiner* — Mushfique Siddique
(74) *Attorney, Agent, or Firm* — IP & T Group LLP

(57) ABSTRACT

A semiconductor memory device includes: a memory cell array including banks; a command/address buffer receiving a command/address based on a system clock; a data input/output circuit inputting/outputting data based on a data clock; a mode control circuit generating mode selection signals indicating different latencies according to a burst length signal and operation information on a first operation mode differentiated based on a ratio of the data clock to the system clock, and a second operation mode differentiated based on a bank mode; and a latency setting circuit setting a latency according to an activated one of the mode selection signals, generating an internal write command by delaying a write command at least by the set latency according to the system clock during a write operation, and generating an internal read command by delaying a read command by the set latency according to the system clock during a read operation.

16 Claims, 17 Drawing Sheets

(51) Int. Cl.
*G11C 11/4096* (2006.01)
*G11C 11/408* (2006.01)

(56) References Cited

U.S. PATENT DOCUMENTS

| | | | | |
|---|---|---|---|---|
| 2003/0198098 | A1* | 10/2003 | Fujioka | G11C 11/406 |
| | | | | 365/200 |
| 2010/0302872 | A1* | 12/2010 | Lee | G11C 11/4076 |
| | | | | 365/194 |
| 2015/0213859 | A1* | 7/2015 | Jang | G11C 7/12 |
| | | | | 365/194 |
| 2020/0160896 | A1* | 5/2020 | Kwak | G11C 7/12 |
| 2020/0211630 | A1* | 7/2020 | Kim | G11C 11/4087 |

* cited by examiner

FIG. 3A

| MR16_OP<7> | WCK2CK |
|---|---|
| 0 | 2:1 |
| 1 | 4:1 |

FIG. 3B

| MR3_OP<4> | MR3_OP<3> | Bank Mode |
|---|---|---|
| 0 | 0 | BG mode |
| 0 | 1 | 8BK mode |
| 1 | 0 | 16BK mode |

FIG. 3C

| CASE | MR16_OP<7> | MR3_OP<4> | MR3_OP<3> | RD/WT to IRDT /IWTT (CK) |
|---|---|---|---|---|
| CASE 1 | 0 | 0 | 0 | 8 |
| CASE 2 | 0 | 1 | 0 | 4 |
| CASE 3 | 0 | 0 | 1 | 4 |
| CASE 4 | 1 | 0 | 0 | 4 |
| CASE 5 | 1 | 1 | 0 | 2 |
| CASE 6 | 1 | 0 | 1 | 2 |

SEMICONDUCTOR MEMORY DEVICE CAPABLE OF OPERATING AT HIGH SPEED, LOW POWER ENVIRONMENT BY OPTIMIZING LATENCY OF READ COMMAND AND WRITE COMMAND DEPENDING ON VARIOUS OPERATION MODES

CROSS-REFERENCE TO RELATED APPLICATION

This application is a division of U.S. patent application Ser. No. 17/097,151 filed on Nov. 13, 2020, which claims benefits of priority of Korean Patent Application No. 10-2020-0077046 filed on Jun. 24, 2020. The disclosure of each of the foregoing application is incorporated herein by reference in its entirety.

BACKGROUND

1. Field

Various embodiments described herein relate to a semiconductor design technology and, more particularly, to a synchronous semiconductor memory device.

2. Description of the Related Art

Semiconductor memory devices have been continuously improved to increase the degree of integration and to increase the operation speed thereof, To increase the operation speed, synchronous memory devices that can operate in synchronization with an external clock have been introduced. First proposed is a single data rate (SDR) synchronous memory device that inputs and outputs one data item over a period of a dock through one data pin in synchronization with a rising edge of the clock external to the memory device. However, since the SDR synchronous memory device is also insufficient to accommodate a system requiring high-speed operation, a double data rate (DDR) synchronous memory device, which processes two data items in one clock period, has been proposed.

More recently developed semiconductor memory devices have been designed to input/output 2 bits of data between a rising edge and a falling edge of an externally applied system clock so as to input/output data at high speed in a low power environment. In other words, the semiconductor memory device is designed to be able to input/output four bits of data in one period of the system clock. To that end, a data clock having a frequency twice that of the system clock is used in the semiconductor memory device. That is, the semiconductor memory device may input/output 4 bits of data in one period of the system clock by using the system clock to receive addresses and commands from the outside and the data clock to input/output data.

SUMMARY

According to embodiments, there is provided a semiconductor memory device capable of controlling the latency of a read command and a write command depending on a first operation mode differentiated according to a ratio of data dock (WCK) to system dock (CK), and a second operation mode differentiated according to an individual bank mode and a bank group mode.

According to an embodiment, a semiconductor memory device may include: a memory cell array including a plurality of banks; a command/address buffer suitable for receiving a command/address based on a system dock; a data input/output circuit suitable for inputting/outputting data based on a data clock; a mode control circuit suitable for generating a plurality of mode selection signals indicating different latencies according to a burst length signal and operation information on a first operation mode differentiated based on a ratio of the data clock to the system clock, and a second operation mode differentiated based on a bank mode; and a latency setting circuit suitable for setting a latency according to an activated one of the mode selection signals, generating an internal write command by delaying a write command at least by the set latency according to the system clock during a write operation, and generating an internal read command by delaying a read command by the set latency according to the system clock during a read operation.

According to an embodiment, a latency setting circuit may include: a clock driving circuit suitable for delaying a write clock by a latency corresponding to an activated one of a plurality of mode selection signals for setting different latencies and generating a write trigger signal, during a write operation; and a write latency circuit suitable for delaying a write command and latching the write command according to the write trigger signal to output an internal write command.

According to an embodiment, a latency setting circuit may include: a control signal generating circuit suitable for generating first to third control signals based on first to third mode selection signals for setting different latencies; a write trigger circuit suitable for generating first to third write division docks by dividing a write dock by certain multiples according to the first to third control signals, and outputting one of the first to third write division docks as a write trigger signal according to the first to third mode selection signals, during a write operation interval; a read trigger circuit suitable for generating first to third read division clocks by dividing a read dock by certain multiples according to the first to third control signals, and outputting one of the first to third read division clocks as a read trigger signal according to the first to third mode selection signals, during a read operation interval; a write latency circuit suitable for latching a write command according to the write trigger signal and outputting an internal write command; and a read latency circuit suitable for latching a read command according to the read trigger signal and outputting an internal read command.

According to an embodiment, an operating method of a semiconductor memory device, may include: delaying a write or a read command by a delay amount with reference to a system clock; and performing an operation based on the delayed write or read command and a data dock, wherein the delay amount depends on a combination of a burst length, a ratio of the data dock to the system dock and a bank mode of the memory device.

According to embodiments described herein, the semiconductor memory device may operate at high speed in a low power environment by optimizing the latency of the read command and write command depending on various operation modes.

According to embodiments described herein, the semiconductor memory device may minimize the area and current consumption by reducing the number of flip-flops provided to control the latency of the read command and write command.

BRIEF DESCRIPTION OF THE DRAWINGS

FIGS. 3A to 3C are tables illustrating a first operation mode and a second operation mode, which are set depending on operation information;

DETAILED DESCRIPTION

Figure 1:
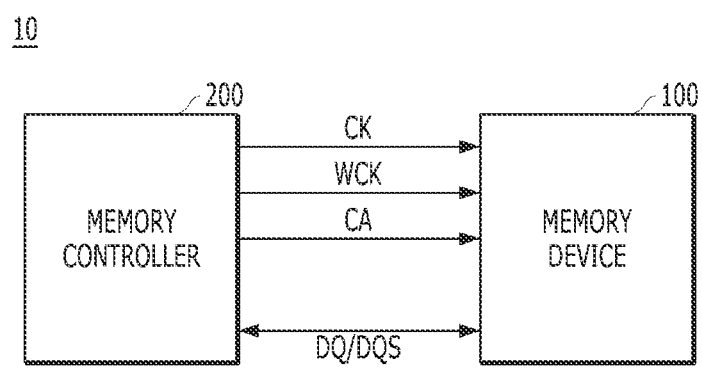
FIG. 1 is a block diagram illustrating a memory system according to an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, various embodiments of the present invention are described in detail with reference to the attached drawings, FIG. 1 is a block diagram illustrating a memory system 10 according to an embodiment of the present invention.

Referring to FIG. 1, the memory system 10 may include a memory controller 200 and a memory device 100. For example, the memory system 10 may be, e.g., a desktop computer, a laptop computer, a workstation, a server, or a mobile device. The memory controller 200 may be an application processor (AP) and may control overall operation of the memory system 10. The memory controller 200 may execute a program according to an application supported by the memory system 10 and may receive data related to the execution of the program from the memory device 100 or transmit the results of execution of the program to the memory device 100.

The memory controller 200 may provide a command/address (CA) to the memory device 100, thereby controlling the operation of the memory device 100. During a write and read operation, the memory device 100 may store data DQ or provide the stored data DQ to the memory controller 200, according to control signals CTRL and the command/address CA. The memory controller 200 and the memory device 100 may exchange data strobe signals DQS along with the data DQ, during a write and read operation. For example, during a write operation, the memory controller 200 may provide the data strobe signal DQS, together with the write data DQ, to the memory device 100. In contrast, during a read operation, the memory device 100 may provide the data strobe signal DQS, along with the read data DQ, to the memory controller 200.

The memory controller 200 may provide a data clock signal WCK (data clock WCK), as well as a system clock signal CK (system clock CK), to the memory device 100 so as to input/output data to/from the memory device 100 at high speed. The memory device 100 may sample the command/address CA using the system clock CK. The memory device 100 may perform a data input/output operation, at high speed, using the data clock WCK. In other words, the memory device 100 may receive the write data DQ and the data strobe signal DQS using the data clock WCK and may output the read data DQ and the data strobe signal DQS to the memory controller 200 using the data clock WCK. The frequency of the data clock WCK may be higher than the frequency of the system clock CK. For example, the frequency of the data clock WCK may be an integer multiple of the frequency of the system clock CK. The memory controller 200 transmits the system clock CK, which has a relatively low frequency, to the memory device 100 all the time during operation but may transmit the lower frequency data clock WCK to the memory device 100 only during the data input/output interval(s).

The memory device 100 may be, e.g., a DRAM (dynamic random access memory) device, an SRAM (static random access memory) device, a TRAM (thyristor random access memory) device, a NAND flash memory device, a NOR flash memory device, an RRAM (resistive random access memory) device, an FRAM (ferroelectric random access memory) device, a PRAM (phase change random access memory) device, an MRAM (magnetic random access memory) device, an SSD (solid state drive), a memory card, or universal flash storage (UFS). In the following description, the memory device 100 is an SDRAM (synchronous dynamic random access memory) device synchronized with the system clock CK provided from the memory controller 200. In particular, the memory device 100 may be an LPDDR5 (low power double data rate 5) SDRAM.

Figure 2:
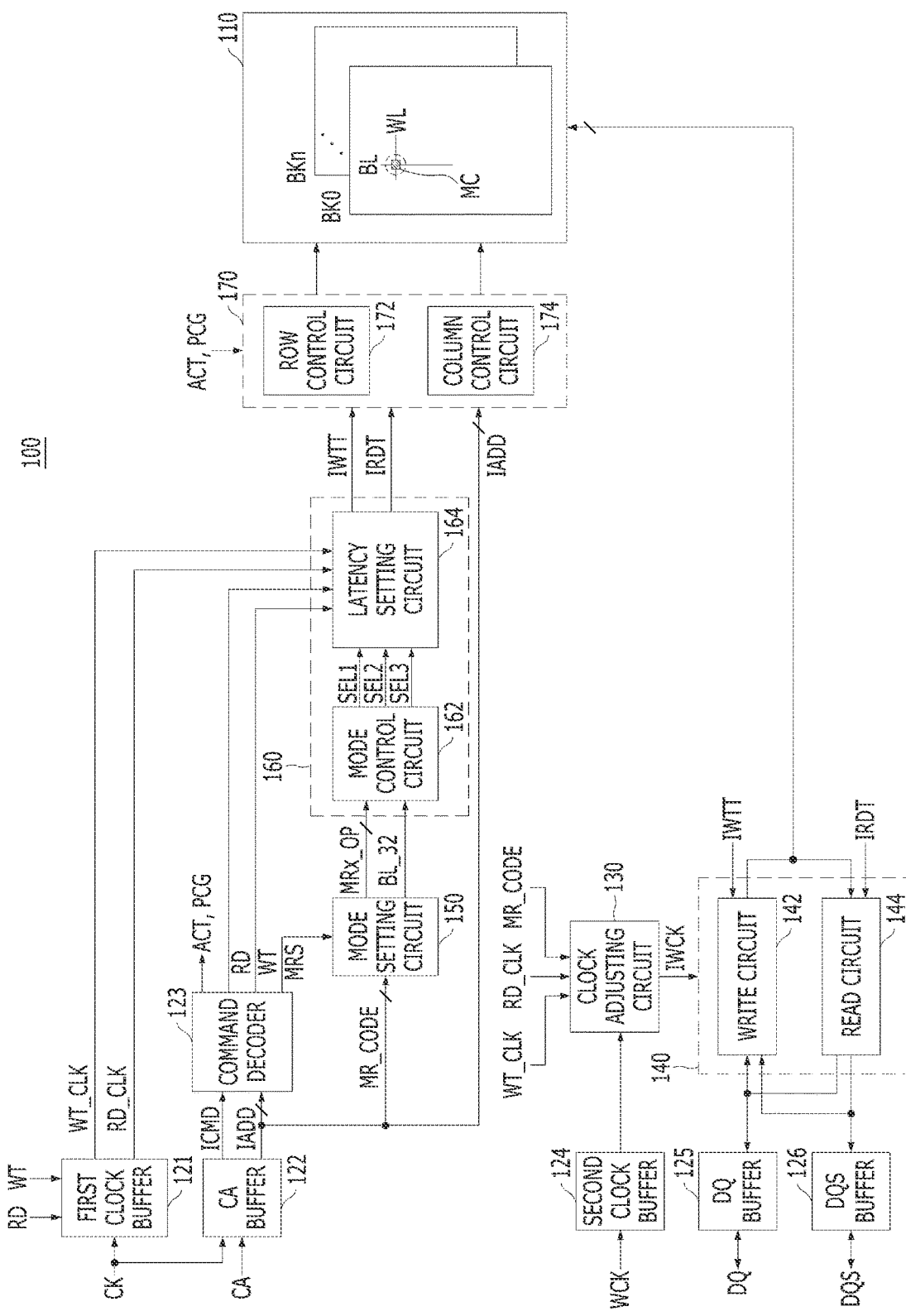
FIG. 2 is a detailed block diagram illustrating a memory device, such as that illustrated in FIG. 1.

FIG. 2 is a detailed block diagram illustrating the memory device 100 as illustrated in FIG. 1.

Referring to FIG. 2, the memory device 100 may include a memory cell array 110, a first dock buffer 121, a command/address (CA) buffer 122, a command decoder 123, a second clock buffer 124, a data (DQ) buffer 125, a data strobe (DQS) buffer 126, a clock adjusting circuit 130, a data input/output circuit 140, a mode setting circuit 150, a latency control circuit 160, and a bank control circuit 170.

The memory cell array 110 may include memory cells MC connected to word lines WL and bit lines BL. The memory cell array 110 may include a plurality of banks BK0 to BKn, where n is an integer of 2 or greater and that is determined based on the capacity of the memory device 100. The number of memory cells MC in the memory cell array 110 is may likewise be determined based on memory device capacity.

The first clock buffer 121 may receive the system clock CK from the memory controller 200. The first clock buffer 121 may receive the system clock CK according to a read command RD and a write command WT and output a read clock RD_CLK and a write clock WT_CLK. In other words, the first dock buffer 121 may provide the system dock CK received during a read operation, as the read dock RD_CLK, and provide the system dock CK received during a write operation, as the write dock WT_CLK, to the internal components of the memory device 100. According to an embodiment, the memory controller 200 may transmit the system clocks CK_t and CK_c to the memory device 100 in a differential manner, and the memory device 100 may include clock buffers receiving the system docks CK_t and CK_c, respectively.

The CA buffer 122 may receive the command/address CA from the memory controller 200 based on the system clock CK. The CA buffer 122 may sample the command/address CA using the system clock CK and output an internal command ICMD and an internal address IADD. As a result, the memory device 100 may be synchronized with the system clock CK.

The command decoder 123 may decode the internal command ICMD output from the CA buffer 122, to generate an active command ACT, a precharge command PCG, a read command RD, a write command WT, and a mode register command MRS.

The second clock buffer 124 may receive the data clock SICK from the memory controller 200. According to an embodiment, the memory controller 200 may transmit the data clocks WCK_t and WCK_c to the memory device 100 in a differential manner, and the memory device 100 may include clock buffers receiving the data docks WCK_t and WCK_c, respectively.

The DQ buffer 125 may receive the write data DQ from the memory controller 200 or may output the read data DQ to the memory controller 200. Since the data DQ is a bilateral signal, the DQ buffer 125 may include both a receiver (not shown) for receiving the write data DQ and a transmitter (not shown) for outputting the read data DQ.

The DQS buffer 126 may receive the data strobe signal DQS from the memory controller 200 or may output the data strobe signal DQS to the memory controller 200. Likewise, since the data strobe signal DQS is a bilateral signal, the DQS buffer 126 may include both a receiver (not shown) and a transmitter (not shown).

The clock adjusting circuit 130 may receive the data clock WCK provided from the second clock buffer 124 and generate an internal data clock IWCK. The clock adjusting circuit 130 may compensate for the difference in duty ratio between the system clock CK provided from the first clock buffer 121 and the data clock WCK provided from the second clock buffer 124. Moreover, the clock adjusting circuit 130 may detect a duty difference between the data clock WCK and the write clock WT_CLK and read clock RD_CLK according to an MR code MR_CODE, adjust the duty cycle of the internal data clock IWCK, and output the same.

The data input/output circuit 140 may input the write data DQ or output the read data DQ based on the internal data clock IWCK. The data input/output circuit 140 may include a write circuit 142 and a read circuit 144.

During a write operation, the write circuit 142 may receive the write data DQ and data strobe signal DQS output from the DQ buffer 125 and the DQS buffer 126. The write circuit 142 may receive the write data DQ using the data strobe signal DQS according to the internal write command IWTT and may sample or parallelize the received write data DQ in synchronization with the internal data dock IWCK. The write circuit 142 may further include a write driver (not shown) for writing parallel data to the memory cell array 110.

During a read operation, the read circuit 144 may receive data output from the memory cell array 110 and provide the read data DQ and the data strobe signal DQS to the DQ buffer 125 and the DQS buffer 126. The read circuit 144 may receive data output from the memory cell array 110 according to the internal read command IRDT and sample or serialize the received data in synchronization with the internal data dock IWCK to thereby generate the read data DQ. The read circuit 144 may generate the data strobe signal DQS using the internal data dock IWCK. The read circuit 144 may transfer the read data DQ and the data strobe signal DQS to the memory controller 200 via the DQ buffer 125 and the DQS buffer 126. The read circuit 144 may further include an input/output sense amplifier (not shown) for detecting and amplifying the data output from the memory cell array 110.

Where the active command ACT and the precharge command PCG are transmitted from the memory controller 200, the internal address IADD output from the CA buffer 122 may include a bank address and a row address. Where the read command RD or the write command WT is transmitted from the memory controller 200, the internal address IADD output from the CA buffer 122 may include a column address. Where the mode register command MRS is transmitted from the memory controller 200, the internal address IADD output from the CA buffer 122 may be an MR code MR_CODE, The above-described commands and addresses may be defined in the JEDEC standard of memory devices.

The mode setting circuit 150 may store the MR code MR_CODE according to the mode register command MRS or output the stored MR code MR_CODE as operation information MRx_OP. The number of registers provided in the mode setting circuit 150 or the size of the MR code MR_CODE may be defined in the JEDEC standard. The memory controller 200 may issue the mode register command MRS and after the MR code MR_CODE stored in the mode setting circuit 150, thereby setting, e.g., operation conditions or operation modes of the memory device 100. For reference, the operation information MRx_OP may be operation codes OPCODE, each of which is constituted of a plurality of bits.

The latency control circuit 160 may delay the write command WT by the latency corresponding to the operation information MRx_OP according to the write dock WT_CLK to thereby generate the internal write command IWTT, and the latency control circuit 160 may delay the read command RD by the latency corresponding to the operation information MRx_OP according to the read dock RD_CLK to thereby generate the internal read command IRDT. According to an embodiment, the latency control circuit 160 may control the latency of the read command RD and the write command WT according to a first operation mode differentiated according to a ratio of the data dock WCK to the system clock CK and a second operation mode differentiated according to an individual bank mode and a bank group mode. The first operation mode and the second operation mode may be set by the operation information MRx_OP.

When the memory device 100 is an LPDDR5 SDRAM, an operation in which the burst length (BL) is 32 (hereinafter, this operation is referred to as 'BL 32 operation') may be supported. For reference, the burst length is a parameter for setting the number of bits of the data DQ input/output via one data path during a read operation or write operation. For example, during the BL 32 operation, 32 bits of data may be input/output via one data path. According to an embodiment, the latency control circuit 160 may control the latency of the read command RD and the write command WT according to the first operation mode and the second operation mode during the BL 32 operation. In the following description, in the BL 32 operation, the first operation mode may include the case in which the ratio WCK2CK of the data dock WCK to the system dock CK is 2:1 and the case in which the ratio WCK2CK is 4:1, and the second operation mode may include the three sub modes: a 16 bank mode, an 8 bank mode, and a 4 bank/4 bank group mode.

FIGS. 3A to 3C are tables illustrating a first operation mode and a second operation mode set depending on operation information MRx_OP. FIGS. 4A to 4F are timing diagrams illustrating an example of setting latency depending on a first operation mode and a second operation mode.

Referring to FIG. 3A, the first operation mode may be determined according to a specific bit MR16_OP<7> of the operation information MR16_OP. Hereinafter, the specific bit MR16_OP<7> is defined as 'first operation information MR16_OP<7>'. For example, where the first operation information MR16_OP<7> is a low bit, the ratio WCK2CK of the data clock WCK to the system clock CK may be set to 2:1. For example, where the first operation information MR16_OP<7> is a high bit, the ratio WCK2CK of the data clock WCK to the system clock CK may be set to 4:1. For reference, in a high-speed operation of 3,200 Mbps or higher, the ratio WCK2CK may be set to ¼ (0.25) to further reduce the current consumption in a peripheral area using the system clock CK and to allow data transmission operation using the data clock WCK to be performed at high speed. In contrast, in a low-speed operation less than 3,200 Mbps, the ratio WCK2CK may be set to ½ (0.5) to enable data transmission operation to be performed stably.

Referring to FIG. 3B, the second operation mode may be determined according to specific bits MR3_OP<4:3> of the operation information MR3_OP. Hereinafter, the specific bits MR3_OP<4:3> are defined as 'second operation information MR3_OP<4:3>.' For example, the second operation mode may be set to the 4 bank group mode (BG mode) when the second operation information MR3_OP<4:3> is "00," the 8 bank mode (8BK mode) when the second operation information MR3_OP<4:3> is "01" and the 16 bank mode (16BK mode) when the second operation information MR3_OP<4:3> is "10."

FIG. 3C illustrates 6 cases, i.e., CASE 1 to CASE 6, of the BL 32 operation and corresponding combinations of the first operation information MR16_OP<7> and the second operation information MR3_OP<4:3>. Also, FIG. 3C illustrates latencies (RD/WT to IRDT/IWTT (CK)) from the command (RD/WT) to the internal command (IRDT/IWTT) for the 6 cases, respectively. FIGS. 4A to 4F are timing diagrams illustrating examples of setting latencies corresponding to the respective 6 cases, i.e., CASE 1 to CASE 6, of the BL 32 operation. CASE 1 to CASE 3 of the BL 32 operation respectively indicate the 4 bank group mode, the 8 bank mode and the 16 bank mode when the ratio WCK2CK of the data clock WCK to the system clock CK is set to 2:1. CASE 4 to CASE 6 of the BL 32 operation respectively indicate the 4 bank group mode, the 8 bank mode and the 16 bank mode when the ratio WCK2CK of the data dock WCK to the system dock CK is set to 4:1.

Figure 4A:
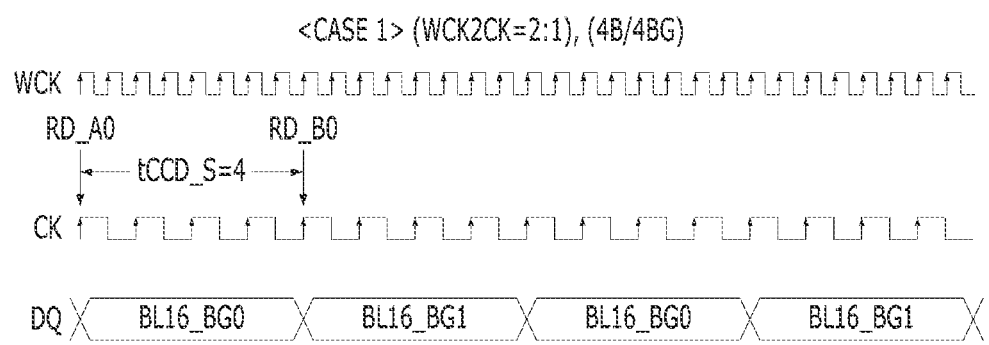
FIGS. 4A to 4F are timing diagrams illustrating an example of setting latency depending on which of a first operation mode and a second operation mode is set.

Referring to FIG. 4A, when the ratio WCK2CK is 2:1 and the second operation mode is the 4 bank/4 bank group mode (CASE 1), a setting of the latency of the read command RD for the BL 32 operation is shown. For reference, the 4 bank/4 bank group mode means the case where four bank groups, each of which includes four banks, are disposed. In CASE 1, the read command RD_BG0 of the first bank group BG0 is input so that the BL16 operation is performed during tCCD_S (i.e., 4CK), and the read command RD_BG1 of the second bank group BG1 is input so that the BL 16 operation may be performed during the next tCCD_S (4CK). Thereafter, the read command RD_BG0 of the same first bank group BG0 is input so that the remaining BL 16 operation is performed during tCCD_S (4CK), and the BL 32 operation of the first bank group BG0 may be completed. Accordingly, the latency control circuit 160 may delay the read command RD by the read dock of 8CK for the BL 32 operation and output the internal read command IRDT. For reference, tCCD_S means the minimum time interval for accessing different bank groups. In the 4 bank group mode, different bank groups may be accessed in the interval corresponding to tCCD_S.

Figure 4B:
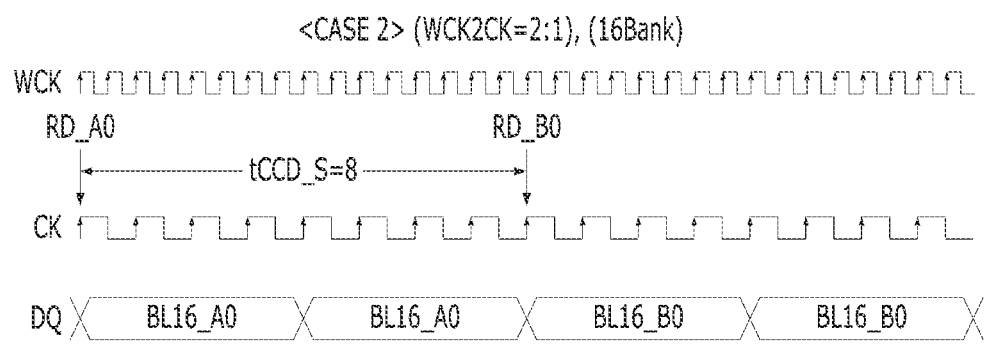

Referring to FIG. 4B, when the ratio WCK2CK is 2:1 and the second operation mode is the 16 bank mode (CASE 2), a setting of the latency of the read command RD for the BL 32 operation is shown. In CASE 2, the read command RD_B0 of the first bank B0 is input so that the BL 32 operation is performed during tCCD_S (i.e., 8CK), and the read command RD_B1 of the second bank B1 is input so that the BL 32 operation may be performed during the next tCCD_S (8CK). Accordingly, the latency control circuit 160 may delay the read command RD by the read clock of 4CK for the BL 32 operation and output the internal read command IRDT. Here, tCCD_S means the minimum time interval for accessing different banks. In the individual bank mode, different banks may be accessed in the interval corresponding to tCCD_S.

Figure 4C:
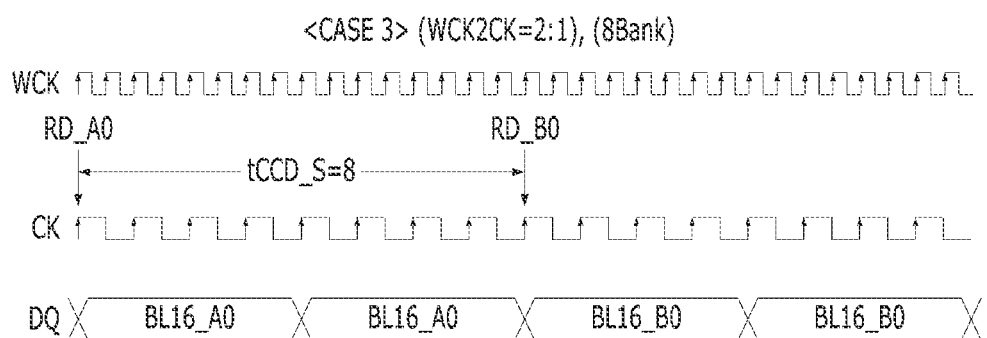

Referring to FIG. 4C, when the ratio WCK2CK is 2:1 and the second operation mode is the 8 bank mode (CASE 3), a setting of the latency of the read command RD for the BL 32 operation is shown. In CASE 3, like in CASE 2, the read command RD_B0 of the first bank B0 is input so that the BL 32 operation may be performed during tCCD_S (i.e., 8CK). Accordingly, the latency control circuit 160 may delay the read command RD by the read clock of 4CK for the BL 32 operation and output the internal read command IRDT.

Figure 4D:
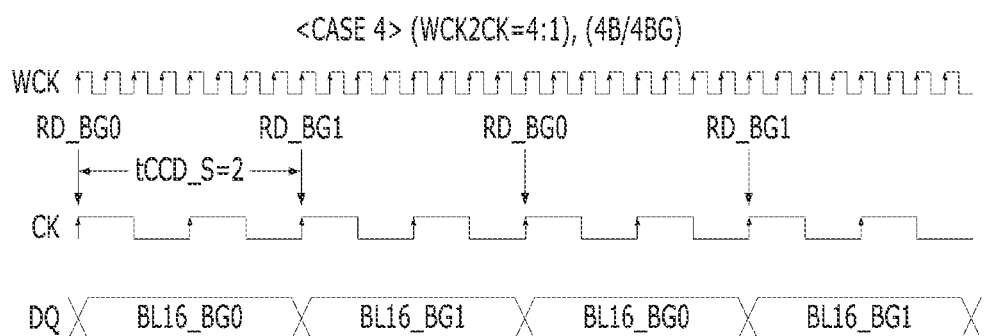

Referring to FIG. 4D, when the ratio WCK2CK is 4:1 and the second operation mode is the 4 bank group mode (CASE 4), a setting of the latency of the read command RD for the BL 32 operation is shown. In CASE 4, the read command RD_BG0 of the first bank group BG0 is input so that the BL16 operation is performed during tCCD_S (i.e., 2CK), and the read command RD_BG1 of the second bank group BG1 is input so that the BL 16 operation may be performed during the next tCCD_S (2CK). Thereafter, the read command RD_BG0 of the same first bank group BG0 is input so that the remaining BL 16 operation is performed during tCCD_S (2CK), and the BL 32 operation of the first bank group BG0 may be completed. Accordingly, the latency control circuit 160 may delay the read command RD by the read dock of 4CK for the BL 32 operation and output the internal read command IRDT.

Figure 4E:
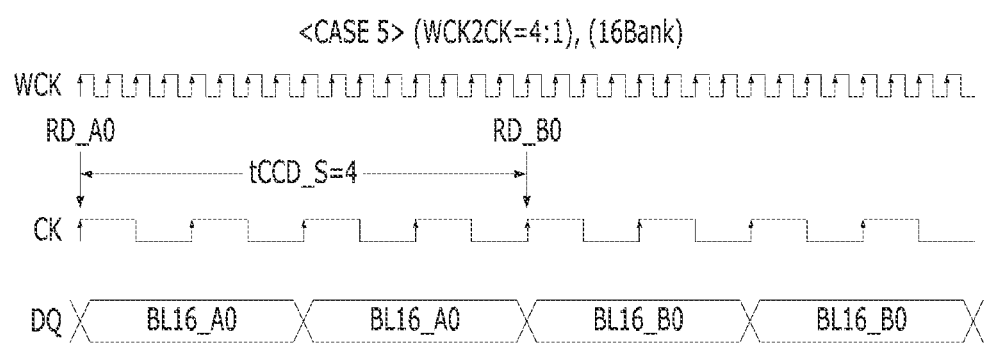

Referring to FIG. 4E, when the ratio WCK2CK is 4:1 and the second operation mode is the 16 bank mode (CASE 5), a setting of the latency of the read command RD for the BL 32 operation is shown. In CASE 5, the read command RD_B0 of the first bank B0 is input so that the BL 32 operation is performed during tCCD_S (i.e., 4CK), and the read command RD_B1 of the second bank B1 is input so that the BL 32 operation may be performed during the next tCCD_S (4CK). Accordingly, the latency control circuit 160 may delay the read command RD by the read clock of 2CK for the BL 32 operation and output the internal read command IRDT.

Figure 4F:
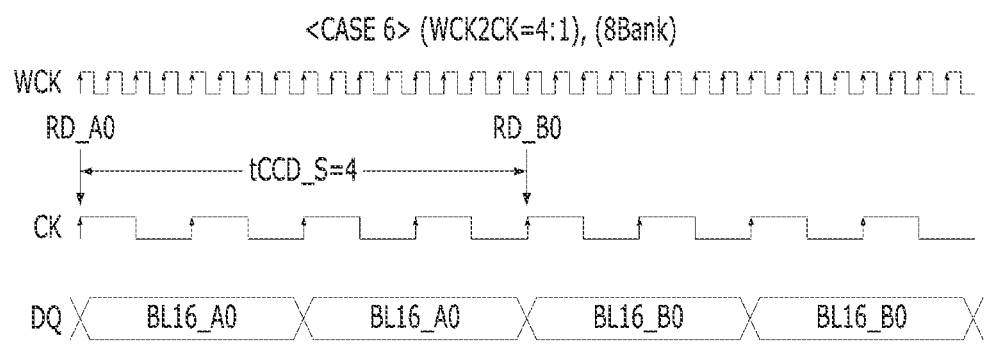

Referring to FIG. 4F, when the ratio WCK2CK is 4:1 and the second operation mode is the 8 bank mode (CASE 6), a setting of the latency of the read command RD for the BL 32 operation is shown. In CASE 6, like in CASE 5, the read command RD_B0 of the first bank B0 is input so that the BL 32 operation may be performed during tCCD_S (i.e., 4CK). Accordingly, the latency control circuit 160 may delay the read command RD by the read dock of 2CK for the BL 32 operation and output the internal read command IRDT.

In sum, as shown in FIG. 3C, the latency control circuit 160 may generate the internal read/write command IRDT/IWTT by delaying the read/write command RD/WT by the latency corresponding to the combination of the burst length signal BL_32 and the operation information MR16_OP and MR3_OP according to the read/write clock RD_CLK or WT_CLK. In this case, a latency of 8CK may be set in CASE 1, a latency of 4CK may be set in CASE 2 to CASE 4, and a latency of 2CK may be set in CASE 5 and CASE 6.

Referring back to FIG. 2, the latency control circuit 160 may include a mode control circuit 162 and a latency setting circuit 164.

The mode control circuit 162 may generate first to third mode selection signals SEL1 to SEL3 based on the operation information MRx_OP. In particular, where the memory device 100 is an LPDDR5 SDRAM, the mode control circuit 162 may receive the operation information MRx_OP and the burst length signal BL_32 from the mode setting circuit 150, to generate the first to third mode selection signals SEL1 to SEL3. In this case, the operation information MRx_OP may include the first operation information MR16_OP<7> and the second operation information MR3_OP<4:3>, and the burst length signal BL_32 may be a signal activated during the BL 32 operation. Further, the first mode selection signal SEL1 may be a signal for selecting a latency of 8CK, the second mode selection signal SEL2 may be a signal for selecting a latency of 4CK, and the third mode selection signal SEL3 may be a signal for selecting a latency of 2CK.

The latency setting circuit 164 may set the latency according to the first to third mode selection signals SEL1 to SEL3, generate the internal write command IWTT by delaying the write command WT by the latency set according to the write dock WT_CLK, and generate the internal read command IRDT by delaying the read command RD by the latency set according to the read clock RD_CLK.

The bank control circuit 170 may include a row control circuit 172 and a column control circuit 174. The row control circuit 172 may activate the word line WL corresponding to the internal address IADD when the active command ACT is activated and may precharge the activated word line WL when the precharge command PCG is activated. In this case, the internal address IADD may include a row address and a bank address. The column control circuit 174 may select at least one bit line BL corresponding to the internal address IADD when the internal read command IRDT or the internal write command IWTT is input. In this case, the internal address IADD may include a column address. Accordingly, the memory cells MC corresponding to the row address and the column address may be selected, and data input/output operation for the selected memory cells may be performed.

As above, the memory device 100 uses the high-speed data clock WCK in the DQ interface for power savings, and the relatively low-speed system clock CK to control the command/address CA. This may ensure a high-speed data transmission operation area and reduce current consumption in the relatively low-speed peripheral area.

A detailed configuration of the latency control circuit 160, according to an embodiment, based on the latency settings described above in connection with FIGS. 3A to 4F, is described below.

Figure 5:
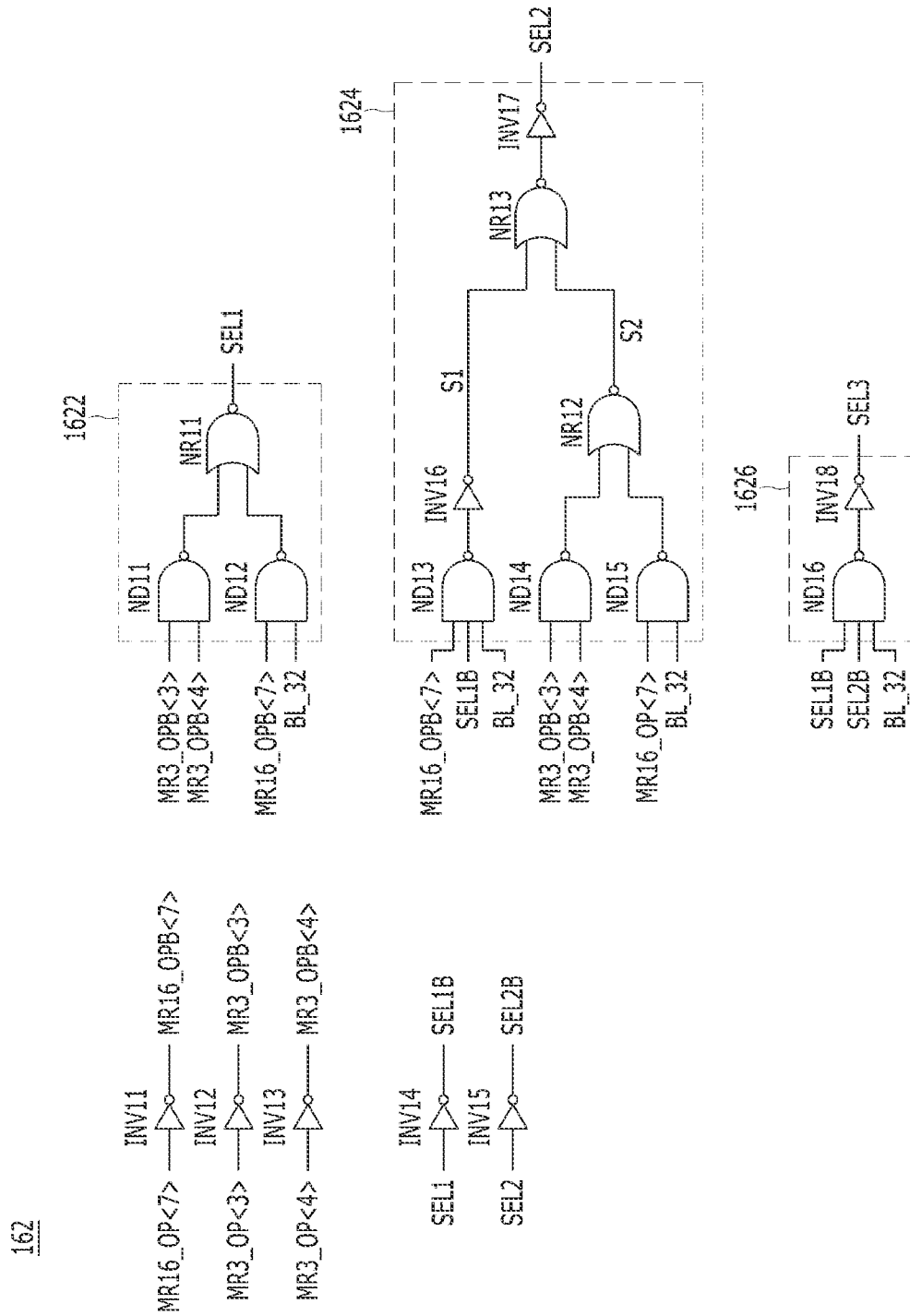
FIG. 5 is a detailed circuit diagram illustrating a mode control circuit, such as that illustrated in FIG. 1.

FIG. 5 is a detailed circuit diagram illustrating the mode control circuit 162 as illustrated in FIG. 1.

Referring to FIG. 5, the mode control circuit 162 may include first to fifth inverters INV11 to INV15 and first to third mode decoders 1622 to 1626.

The first inverter INV11 may invert the first operation information MR16_OP<7> to thereby output the inverted first operation information MR16_OPB<7>, and the second inverter INV12 and the third inverter INV13 may invert each bit of the second operation information MR3_OP<4:3> to thereby output the inverted second operation information MR3_OPB<4:3>. The fourth inverter INV14 and the fifth inverter INV15 may invert the first mode selection signal SEA and the second mode selection signal SEL2, respectively, thereby outputting the inverted first and second mode selection signals SEL1B and SEL2B.

The first mode decoder 1622 may generate the first mode selection signal SEL1 for setting the latency (i.e., 8CK) corresponding to CASE 1 described above in connection with FIG. 3C. The first mode decoder 1622 may include first and second NAND gates ND11 and ND12 and a first NOR gate NR11. The first NAND gate ND11 may perform a logic NAND operation on each bit of the inverted second operation information MR3_OPB<3:4>, and the second NAND gate ND12 may perform a logic NAND operation on the inverted first operation information MR16_OPB<7> and the burst length signal BL_32. The first NOR gate NR11 may perform a logic NOR operation on the outputs of the first and second NAND gates ND11 and ND12. By the above-described configuration, the third mode decoder 1626 may generate the first mode selection signal SEL1 which is activated at the logic high level when all of the bits of the inverted second operation information MR3_OPB<3:4>, the inverted first operation information MR16_OPB<7>, and the burst length signal BL_32 are at the logic high level. In other words, the first mode decoder 1622 may generate the activated first mode selection signal SEL1 when the ratio WCK2CK is 2:1 in the bank group mode (CASE 1).

The second mode decoder 1624 may generate the second mode selection signal SE1_2 for setting the latency (i.e., 4CK) corresponding to CASE 2 to CASE 4 described above in connection with FIG. 3C. The second mode decoder 1624 may include a third to fifth NAND gate ND13 to ND15, a second and third NOR gate NR12 and NR13, and a sixth and seventh inverter INV16 and INV17. The third NAND gate ND13 and the sixth inverter INV16 may perform a logic AND operation on the inverted first operation information MR16_OPB<7>, the inverted first mode selection signal SEL1B, and the burst length signal BL_32, outputting a first intermediate signal S1. The fourth NAND gate ND14 may perform a logic NAND operation on each bit of the inverted second operation information MR3_OPB<3:4>, and the fifth NAND gate ND15 may perform a logic NAND operation on the first operation information MR16_OP<7> and the burst length signal BL_32. The second NOR gate NR12 may perform a logic NOR operation on the outputs of the fourth and fifth NAND gates ND14 and ND15, thereby outputting a second intermediate signal S2. The third NOR gate NR13 and the seventh inverter INV17 may perform a logic OR operation on the first intermediate signal S1 and the second intermediate signal S2. By the above-described configuration, the second mode decoder 1624 may generate the second mode selection signal SEL2 which is activated at the logic high level when all of the inverted first operation information MR16_OPB<7>, the inverted first mode selection signal SEL1B, and the burst length signal BL_32 are at the logic high level (S1) or when all of the first operation information MR16_0P<7>, the inverted second operation information MR3_OPB<4:3>, and the burst length signal BL_32 are at the logic high level (S2). In other words, the second mode decoder 1624 may generate the activated second mode selection signal SEL2 when the ratio WCK2CK is 2:1 in the individual bank mode (CASE 2 & CASE 3) or when the ratio WCK2CK is 4:1 in the bank group mode (CASE 4).

The third mode decoder 1626 may generate the third mode selection signal SEL3 for setting the latency (i.e., 2CK) corresponding to CASE 5 and CASE 6 described above in connection with FIG. 3C. The third mode decoder 1626 may include a sixth NAND gate ND16 and an eighth inverter INV18. The sixth NAND gate ND16 and the eighth inverter INV18 may perform a logic AND operation on the inverted first mode selection signal SEL1B, the inverted second mode selection signal SEL2B, and the burst length signal BL_32, thereby generating the third mode selection signal SEL3. By the above-described configuration, the third mode decoder 1626 may generate the second mode selection signal SEL2 which is activated at the logic high level when all of the inverted first mode selection signal SEL1B, the inverted second mode selection signal SEL2B, and the burst length signal BL_32 are at the logic high level. In other words, the third mode decoder 1626 may generate the activated third mode selection signal SEL3 when the ratio WCK2CK is 4:1 in the individual bank mode (CASE 5 & CASE 6).

Figure 6:
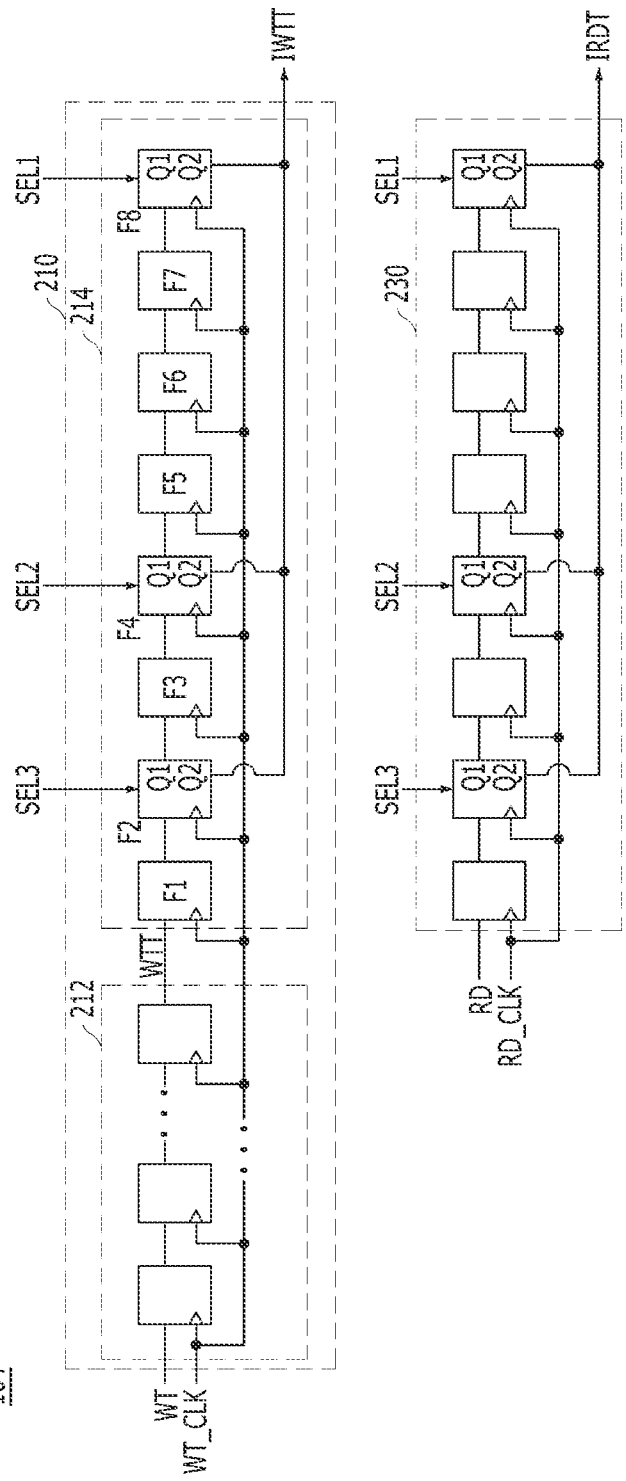
FIG. 6 is a detailed circuit diagram illustrating a latency setting circuit according to a first embodiment of the present invention.

FIG. 6 is a detailed circuit diagram illustrating the latency setting circuit 164 according to a first embodiment of the present invention.

Referring to FIG. 6, the latency setting circuit 164 may include a write latency circuit 210 and a read latency circuit 230.

The write latency circuit 210 may include a preliminary latency circuit 212 and a main latency circuit 214. The preliminary latency circuit 212 may generate a preliminary write command WTT by delaying the write command WT by a first latency according to the write dock WT_CLK. In this case, the first latency is a delay time defined in the process from the input of the write command to the actual input of the write data and may correspond to 'write latency WL+burst length BL/width (N) of one data item+1'. The main latency circuit 214 may set a second latency according to the first to third mode selection signals SEL1 to SEL3 and generate the internal write command IWTT by further delaying the preliminary write command WTT by the second latency according to the write clock WT_CLK. In this case, the main latency circuit 214 may support the BL 32 operation. The second latency may be a delay time varied depending on the activated mode selection signal among the first to third mode selection signals SEL1 to SEL3. As a result, the internal write command IWTT may be generated by delaying the write command WT by the first and second latencies according to the write clock WT_CLK.

More specifically, the preliminary latency circuit 212 may include a plurality of flip-flops which are connected in series and sequentially shift the write command WT according to the write clock WT_CLK to thereby output the preliminary write command WTT. The number of the flip-flops may be determined according to the first latency. In other words, the first latency may be determined to be n*CK', where n is the number of flip-flops.

The main latency circuit 214 may include first to eighth flip-flops F1 to F8 that are connected in series and shift the preliminary write command WTT by a set number of clock cycles according to the write clock WT_CLK to thereby output the internal write command IWTT. In this case, since the maximum latency in CASE 1 to CASE 6 shown in FIG. 3C is 8CK, the main latency circuit 214 may include eight flip-flops. In this case, among the first to eighth flip-flops F1 to F8, the second flip-flop F2, the fourth flip-flop F4, and the eighth flip-flop F8 may output one of the first output signal Q1 or the second output signal Q2 according to a corresponding signal among the first to third mode selection signals SEL1 to SEL3. The first output signal Q1 of each flip-flop F2, F4, and F8 may be provided to the succeeding flip-flops, and the second output signal Q2 may be output as the internal write command IWTT. For example, the second flip-flop F2 may output one of the first output signal Q1 or the second output signal Q2 according to the first mode selection signal SEL1. The second flip-flop F2 may output the second output signal Q2 as the internal write command IWTT when the first mode selection signal SEL1 is activated. Likewise, the fourth flip-flop F4 may output the second output signal Q2 as the internal write command IWTT when the second mode selection signal SEL2 is activated, and the eighth flip-flop F8 may output the second output signal Q2 as the internal write command IWTT when the third mode selection signal SEL3 is activated. By the above-described configuration, the main latency circuit 214 may delay, by 2CK, and output the preliminary write command WTT when the first mode selection signal SEL1 is activated, delay, by 4CK, and output the preliminary write command WTT when the second mode selection signal SEL2 is activated, and delay, by 8CK, and output the preliminary write command WTT when the third mode selection signal SEL3 is activated.

The read latency circuit 230 may set the second latency according to the first to third mode selection signals SEL1 to SEL3, and may generate the internal read command IRDT by delaying the read command RD by the second latency according to the read dock RD_CLK to thereby generate the internal read command IRDT. The read latency circuit 230 may support the BL 32 operation. The second latency may be a delay time varied depending on the activated mode selection signal among the first to third mode selection signals SEL1 to SEL3. The read latency circuit 230 has substantially the same configuration as the main latency circuit 214.

As described above, the main latency circuit 214 and the read latency circuit 230 may be added to perform the BL 32 operation. In other words, during the BL 32 operation, a total of 16 flip-flops may be added.

Figure 7:
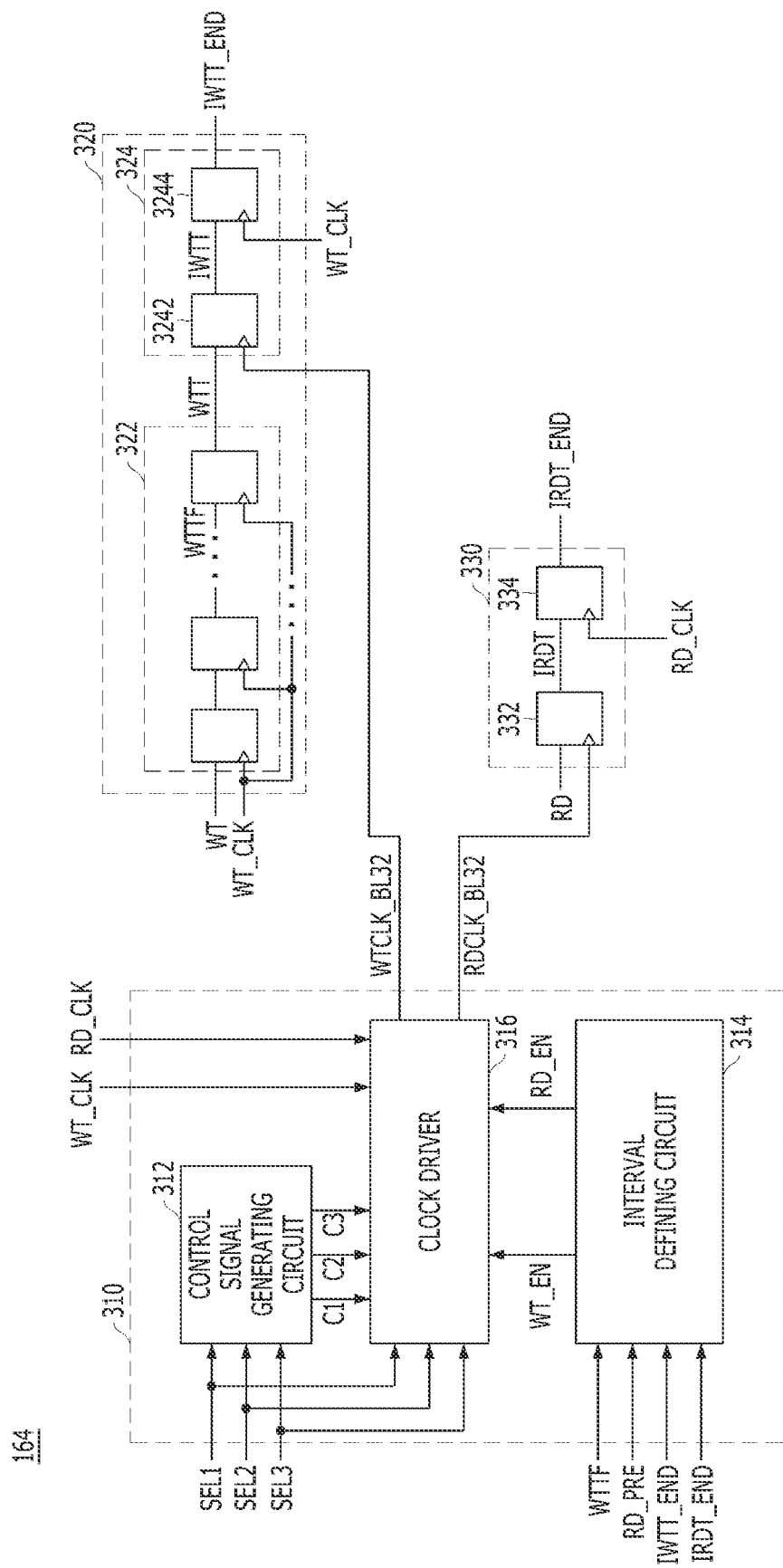
FIG. 7 is a detailed circuit diagram illustrating a latency setting circuit according to a second embodiment of the present invention.
Figure 8:
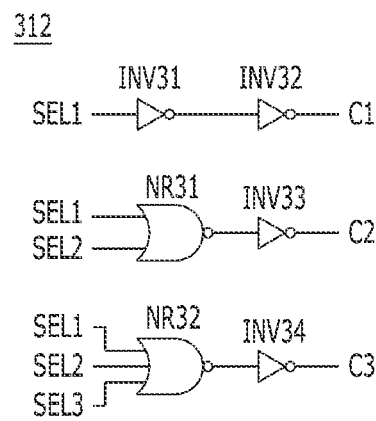
FIG. 8 is a circuit diagram illustrating a control signal generating circuit, such as that illustrated in FIG. 7.
Figure 9:
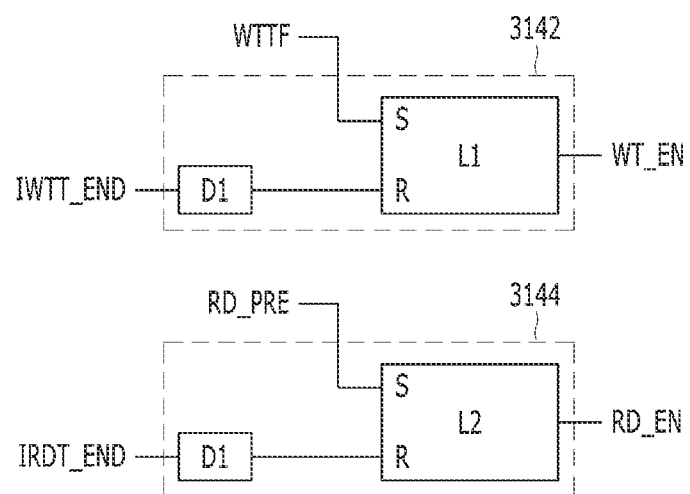
FIG. 9 is a circuit diagram illustrating an interval defining circuit, such as that illustrated in FIG. 7.
Figure 10:
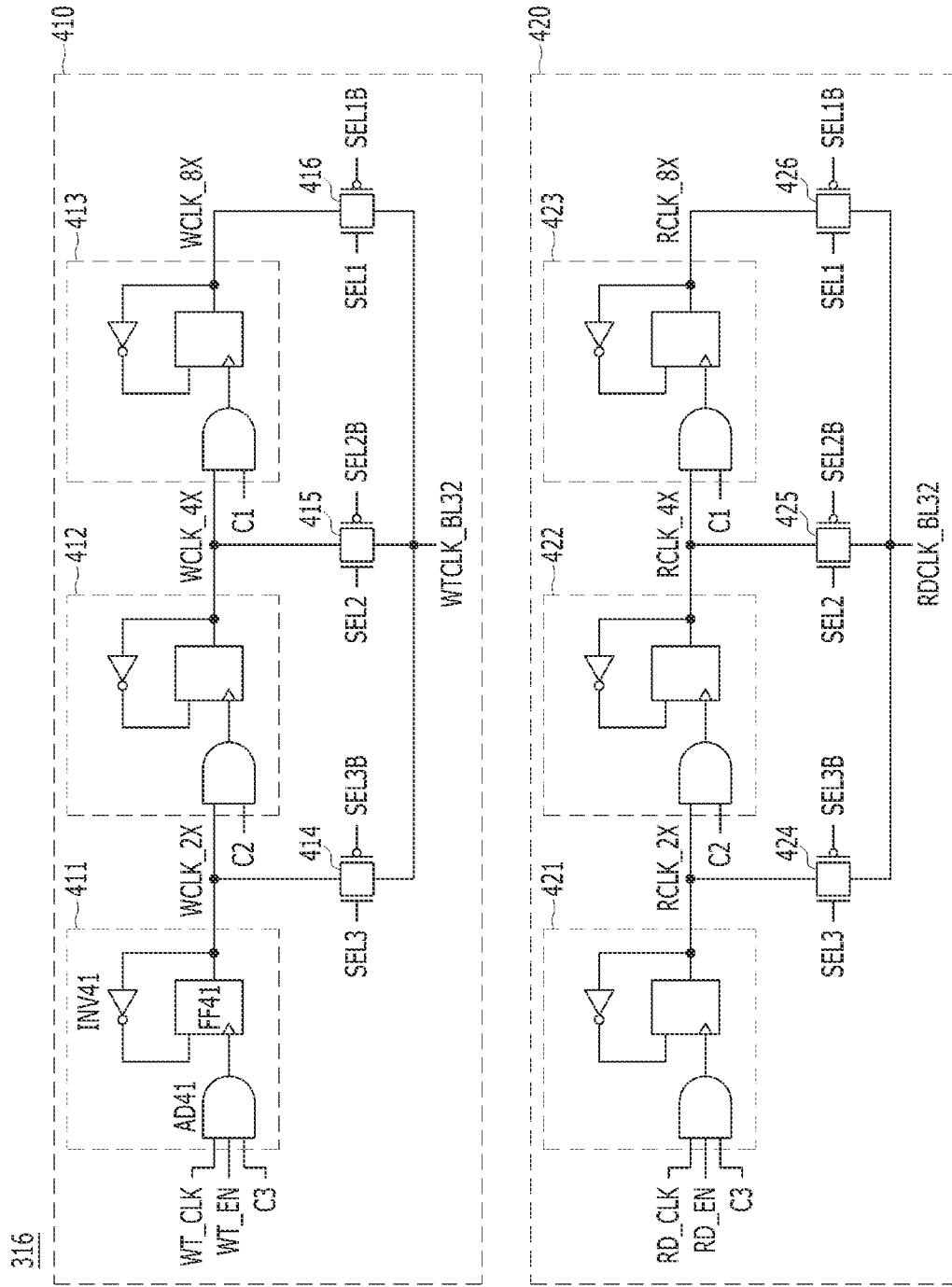
FIG. 10 is a circuit diagram illustrating a clock driver, such as that illustrated in FIG. 7.

FIG. 7 is a detailed circuit diagram illustrating the latency setting circuit 164 according to a second embodiment of the present invention. FIG. 8 is a circuit diagram illustrating a control signal generating circuit 312 as illustrated in FIG. 7. FIG. 9 is a circuit diagram illustrating an interval defining circuit 314 as illustrated in FIG. 7. FIG. 10 is a circuit diagram illustrating a dock driver 316 as illustrated in FIG. 7.

Referring to FIG. 7, the latency setting circuit 164 may include a clock driving circuit 310, a write latency circuit 320, and a read latency circuit 330.

During a write operation, the clock driving circuit 310 may delay the write clock WT_CLK by the latency corresponding to the activated mode selection signal among the first to third mode selection signals SE1_1 to SEL3 to thereby generate a write trigger signal WTCLK_BL32. During a read operation, the clock driving circuit 310 may delay the read clock RD_CLK by the latency corresponding to the activated mode selection signal among the first to third mode selection signals SEL1 to SEL3 to thereby generate a read trigger signal RDCLK_BL32. In this case, the clock driving circuit 310 may receive a write start signal WTTF and a write end signal IWTT_END to define a write operation interval and may receive a read start signal RD_PRE and a read end signal IRDT_END to define a read operation interval.

Specifically, the clock driving circuit 310 may include a control signal generating circuit 312, an interval defining circuit 314, and a clock driver 316.

The control signal generating circuit 312 may generate first to third control signals C1 to C3 based on which of the first to third mode selection signals SEL1 to SEL3 or combination thereof is activated. The control signal generating circuit 312 may activate and output the first control signal C1 when the first mode selection signal SEL1 is activated. The control signal generating circuit 312 may activate and output the second control signal C2 when any one of the first and second mode selection signals SEL1 and SEL2 is activated. The control signal generating circuit 312 may activate and output the third control signal C3 when any one of the first to third mode selection signals SEL1 to SEL3 is activated.

For example, referring to FIG. 8, the control signal generating circuit 312 may include first and second NOR gates NR31 and NR32 and first to fourth inverters INV31 to INV34. The first and second inverters INV31 and INV32 may buffer the first mode selection signal SEL1 and output the first control signal C1. The first NOR gate NR31 and the third inverter INV33 may perform a logic OR operation on the first and second mode selection signals SEL1 and SE2, outputting the second control signal C2. The second NOR gate NR32 and the fourth inverter INV34 may perform a logic OR operation on the first to third mode selection signals SEL1 to SEL3, outputting the third control signal C3.

Referring back to FIG. 7, the interval defining circuit 314 may receive the write start signal WTTF, the read start signal RD_PRE, the write end signal IWTT_END, and the read end signal IRDT_END, generating a write interval signal WT_EN and a read interval signal RD_EN. The interval defining circuit 314 may generate the write interval signal WT_EN, which is activated according to the write start signal WTTF and is deactivated according to the write end signal IWTT_END, and the read interval signal RD_EN, which is activated according to the read start signal RD_PRE and is deactivated according to the read end signal IRDT_END. In other words, the write interval signal WT_EN is a signal for defining the write operation interval, and the read interval signal RD_EN is a signal for defining the read operation interval.

For example, referring to FIG. 9, the interval defining circuit 314 may include a write interval circuit 3142 and a read interval circuit 3144. The write interval circuit 3142 may include a first delay D1 and a first SR latch L1. The first delay D1 may delay the write end signal IWTT_END a set time. The first SR latch L1 may generate the write interval signal WT_EN which is set according to the write start signal WTTF and is reset according to the output of the first delay D1. The read interval circuit 3144 may include a second delay D2 and a second SR latch L2. The second delay D2 may delay the read end signal IRDT_END a set time. The second SR latch L2 may generate the read interval signal RD_EN which is set according to the read start signal RD_PRE and is reset according to the output of the second delay D2.

Referring back to FIG. 7, the clock driver 316 may generate the write trigger signal WTCLK_BL32 and the read trigger signal RDCLK_BL32 according to the write interval signal WT_EN, the read interval signal RD_EN, the first to third control signals C1 to C3, the first to third mode selection signals SEL1 to SEL3, the write dock WT_CLK, and the read dock RD_CLK. The dock driver 316 may generate the write trigger signal WTCLK_BL32 according to the first to third control signals C1 to C3 and the first to third mode selection signals SEL1 to SEL3 during the write operation interval and the read trigger signal RDCLK_BL32 according to the first to third control signals C1 to C3 and the first to third mode selection signals SEL1 to SEL3 during the read operation interval.

For example, referring to FIG. 10, the dock driver 316 may include a write trigger circuit 410 and a read trigger circuit 420. The write trigger circuit 410 may generate first to third write division clocks WCLK_2X, WCLK_4X, and WCLK_8X by dividing the write clock WT_CLK by certain multiples, according to the first to third control signals C1 to C3 during the write operation defined according to the write interval signal WT_EN, i.e., during the active interval of the write interval signal WT_EN. The write trigger circuit 410 may output, as the write trigger signal WTCLK_BL32, one of the first to third write division clocks WCLK_2X, WCLK_4X, and WCLK_8X according to the first to third mode selection signals SEL1 to SEL3. The read trigger circuit 420 may generate first to third read division clocks RCLK_2X, RCLK_4X, and RCLK_8X by dividing the read clock RD_CLK by certain multiples according to the first to third control signals C1 to C3, during the read operation defined according to the read interval signal RD_EN. The read trigger circuit 420 may output, as the read trigger signal RDCLK_BL32, one of the first to third read division clocks RCLK_2X, RCLK_4X, and RCLK_8X, according to the first to third mode selection signals SEL1 to SEL3.

Specifically, the write trigger circuit 410 may include first to third dividing circuits 411 to 413 and first to third selecting circuits 414 to 416.

The first dividing circuit 411 may generate the first write division clock WCLK_2X by dividing the frequency of the write clock WT_CLK by 2, when both the write interval signal WT_EN and the third control signal C3 are activated. The first dividing circuit 411 may include an AND gate AD41, which performs a logic AND operation on the write interval signal WT_EN, the third control signal C3, and the write clock WT_CLK, a flip-flop FF41, which receives the output of the AND gate AD41 as the clock signal and receives the inverted signal of the output signal as the input signal, and an inverter INV41, which inverts and provides, as the input signal, the output signal of the flip-flop FF41. The second dividing circuit 412 may generate the second write division clock WCLK_4X by dividing the frequency of the first write division clock WCLK_2X by 2, when the second control signal C2 is activated. The third dividing circuit 413 may generate the third write division clock WCLK_8X by dividing the frequency of the second write division clock WCLK_4X by 2, when the first control signal C1 is activated. The second and third dividing circuits 413 may have substantially the same configuration as the first dividing circuit 411.

The first selecting circuit 414 may output the first write division dock WCLK_2X as the write trigger signal WTCLK_BL32 according to the third mode selection signal SEL3 and the inverted third mode selection signal SEL3B. The second selecting circuit 415 may output the second write division clock WCLK_4X as the write trigger signal WTCLK_BL32 according to the second mode selection signal SEL2 and the inverted second mode selection signal SEL2B. The third selecting circuit 416 may output the third write division clock WCLK_8X as the write trigger signal WTCLK_BL32 according to the first mode selection signal SEL1 and the inverted first mode selection signal SEL1B. The first to third selecting circuits 414 to 416 each may be configured as a transmission gate.

By the above-described configuration, the write trigger circuit 410 may output the third write division clock WCLK_8X generated by dividing, by 8, the frequency of the write clock WT_CLK, as the write trigger signal WTCLK_BL32, when the first mode selection signal SEL1 is activated and, thus, the first to third control signals C1 to C3 are activated. The write trigger circuit 410 may output the second write division clock WCLK_4X generated by dividing, by 4, the frequency of the write clock WT_CLK, as the write trigger signal WTCLK_BL32, when the second mode selection signal SEL2 is activated and, thus, the second and third control signals C2 and C3 are activated. The write trigger circuit 410 may output the first write division clock WCLK_2X generated by dividing, by 2, the frequency of the write clock WT_CLK, as the write trigger signal WTCLK_BL32, when the third mode selection signal SEL3 is activated and, thus, the third control signal C3 is activated.

The read trigger circuit 420 may include a fourth to sixth dividing circuit 421 to 423 and a fourth to sixth selecting circuit 424 to 426. As understood from FIG. 10, each component of the read trigger circuit 420 has substantially the same configuration as its counterpart component in the write trigger circuit 410.

Referring back to FIG. 7, the write latency circuit 320 may include a preliminary latency circuit 322 and a main latency circuit 324. The preliminary latency circuit 322 has substantially the same configuration as the preliminary latency circuit 212 of FIG. 6. According to an embodiment, the input signal of the last flip-flop in the preliminary latency circuit 322 may be provided as the write start signal WTTF, and the output signal may be provided as the preliminary write command WTT. The main latency circuit 324 may latch the preliminary write command WTT according to the write trigger signal WICLK_BL32 and output the internal write command IWTT. The main latency circuit 324 may latch, one more time, the internal write command IWTT according to the write clock WT_CLK and output the write end signal IWTT_END. The main latency circuit 324 may include a first flip-flop 3242 and a second flip-flop 3244, The first flip-flop 3242 may latch the preliminary write command WTT in synchronization with the write trigger signal WTCLK_BL32 and output the internal write command IWTT. The second flip-flop 3244 may latch the internal write command IWTT in synchronization with the write dock WT_CLK and output the write end signal IWTT_END.

The read latency circuit 330 may latch the read command RD according to the read trigger signal RDCLK_BL32 and output the internal read command IRDT. The read latency circuit 330 may latch, one more time, the internal read command IRDT according to the read clock RD_CLK and output the read end signal IRDT_END. The read latency circuit 330 may include a third flip-flop 332 and a fourth flip-flop 334. The third flip-flop 332 may latch the read command RD in synchronization with the read trigger signal RDCLK_BL32 and output the intern& read command IRDT. The fourth flip-flop 334 may latch the internal read command IRDT in synchronization with the read clock RD_CLK and output the read end signal IRDT_END.

Although not shown, the read start signal RD_PRE may be activated one clock CK cycle or a half dock cycle earlier than the read command RD. As set forth above, in embodiments described herein, a signal activated one clock (CK) cycle earlier than the preliminary write command WTT is used as the write start signal WTTF, a signal activated one dock (CK) cycle earlier than the read command RD is used as the read start signal RD_PRE, a signal activated one dock (CK) cycle later than the internal write command TWIT is used as the write end signal IWTT_END, and a signal activated one dock (CK) cycle later than the internal read command IRDT is used as the read end signal IRDT_END. However, the present invention is not limited to that specific arrangement; variations in that regard may be made consistent with the teachings herein. For example, signals coming multiple clock cycles earlier or later than the write command WT and the read command RD may be used as the start signal and end signal to define each operation interval.

The operation of setting a latency in a semiconductor memory device according to the second embodiment of the present invention is described below with reference to the drawings.

Figure 11:
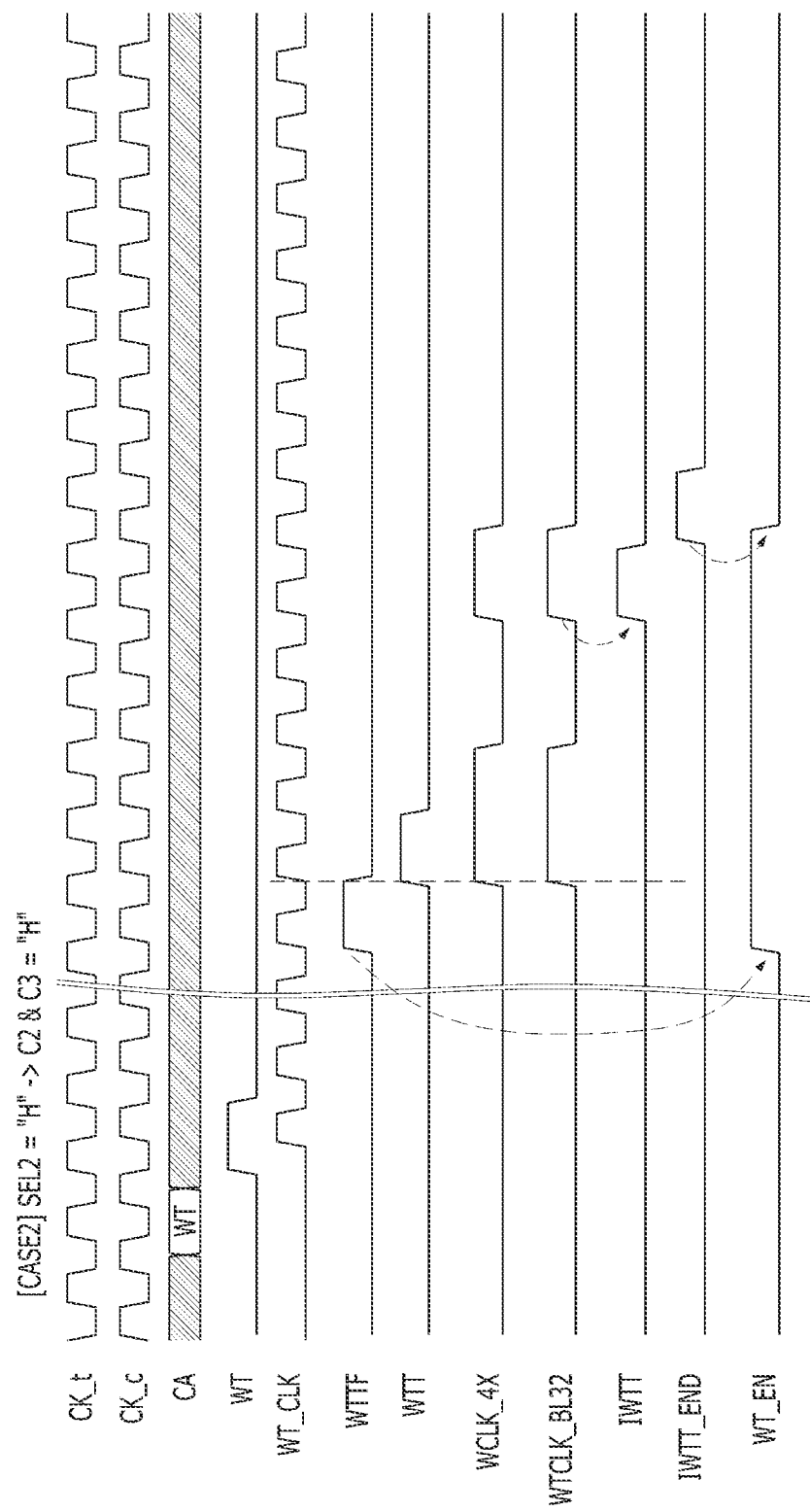
FIG. 11 is a timing diagram illustrating a write operation according to the second embodiment of the present invention.

FIG. 11 is a timing diagram illustrating a write operation according to the second embodiment of the present invention, FIG. 11 illustrates an example in which the second mode selection signal SEL2 is activated at the logic high level in CASE 2. The control signal generating circuit 312 may activate the second and third control signals C2 and C3 at the logic high level according to the second mode selection signal SEL2.

The CA buffer 122 receives the command/address CA indicating the write operation for performing the BL 32 operation based on the system clock CK, and the command decoder 123 decodes the internal command ICMD output from the CA buffer 122 to thereby generate the write command WT. The first clock buffer 121 may receive the system clock CK according to the write command WT and output the write clock WT_CLK.

The preliminary latency circuit 322 may generate a preliminary write command WTT by delaying the write command WT a set first latency (WL+BL/N+1) according to the write dock WT_CLK. In this case, the preliminary latency circuit 322 outputs a signal activated one clock (CK) cycle earlier than the preliminary write command WTT as the write start signal WTTF.

The interval defining circuit 314 activates the write interval signal WT_EN according to the write start signal WTTF. When the write interval signal WT_EN is activated, with the second and third control signals C2 and C3 activated, the clock driver 316 generates the first write division clock WCLK_2X by dividing, by 2, the frequency of the write clock WT_CLK and generates the second write division clock WCLK_4X by dividing, by 2, the frequency of the first write division clock WCLK_2X. In this case, the clock driver 316 may output the second write division clock WCLK_4X as the write trigger signal WTCLK_BL32 according to the second mode selection signal SEL2.

The main latency circuit 324 latches the preliminary write command WTT in response to a rising edge of the write trigger signal WTCLK_BL32 to thereby output the internal write command IWTT and latches, one more time, the internal write command IWTT according to the write clock WT_CLK to thereby output the write end signal IWTT_END. The interval defining circuit 314 may deactivate the write interval signal WT_EN according to the write end signal IWTT_END.

Figure 12:
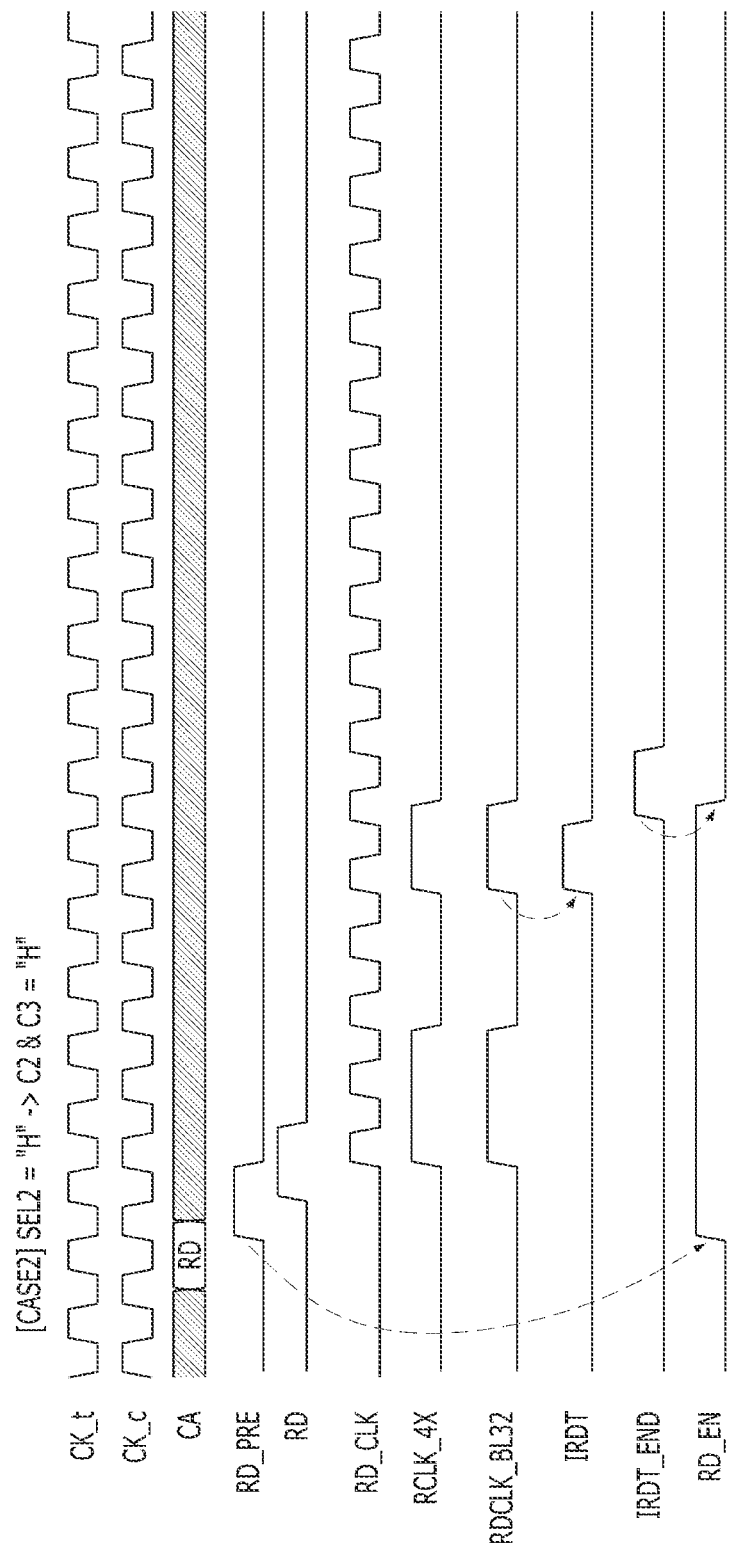
FIG. 12 is a timing diagram illustrating a read operation according to the second embodiment of the present invention.

FIG. 12 is a timing diagram illustrating a read operation according to the second embodiment of the present invention.

FIG. 12 illustrates an example in which the second mode selection signal SEL2 is activated at the logic high level in CASE 2 and, likewise, the second and third control signals C2 and C3 are activated at the logic high level.

The CA buffer 122 receives the command/address CA indicating the read operation for performing the BL 32 operation based on the system dock CK, and the command decoder 123 decodes the internal command ICMD output from the CA buffer 122 to thereby generate the read command RD. The first dock buffer 121 may receive the system dock CK according to the read command RD and output the read dock RD_CLK.

The interval defining circuit 314 activates the read interval signal RD_EN according to the read start signal RD_PRE which is activated a half clock cycle earlier than the read command RD. When the read interval signal RD_EN is activated, with the second and third control signals C2 and C3 activated, the dock driver 316 sequentially divides, by 2, the frequency of the read dock RD_CLK, thereby generating the first and second read division clocks RCLK_2X and RCLK_4X. In this case, the clock driver 316 may output the second read division clock RCLK_4X as the read trigger signal RDCLK_BL32 according to the second mode selection signal SEL2.

The read latency circuit 330 latches the read command RD according to the read trigger signal RDCLK_BL32 to thereby output the internal read command IRDT and latches, one more time, the internal read command IRDT according to the read dock RD_CLK to thereby output the read end signal IRDT_END. The interval defining circuit 314 may deactivate the read interval signal RD_EN according to the read end signal IRDT_END, so that the read operation may be terminated.

As described above, according to the second embodiment of the present invention, the number of flip-flops which are added to perform the BL 32 operation may be reduced, so that the chip area may be shrunken, and the power consumption due to the toggling current may be decreased.

Since two write commands WT are input in the bank group mode, the timing margin may not be sufficient as compared with that in the individual bank mode. A method for further securing a timing margin in the bank group mode is described below according to a third embodiment of the present invention.

Figure 13:
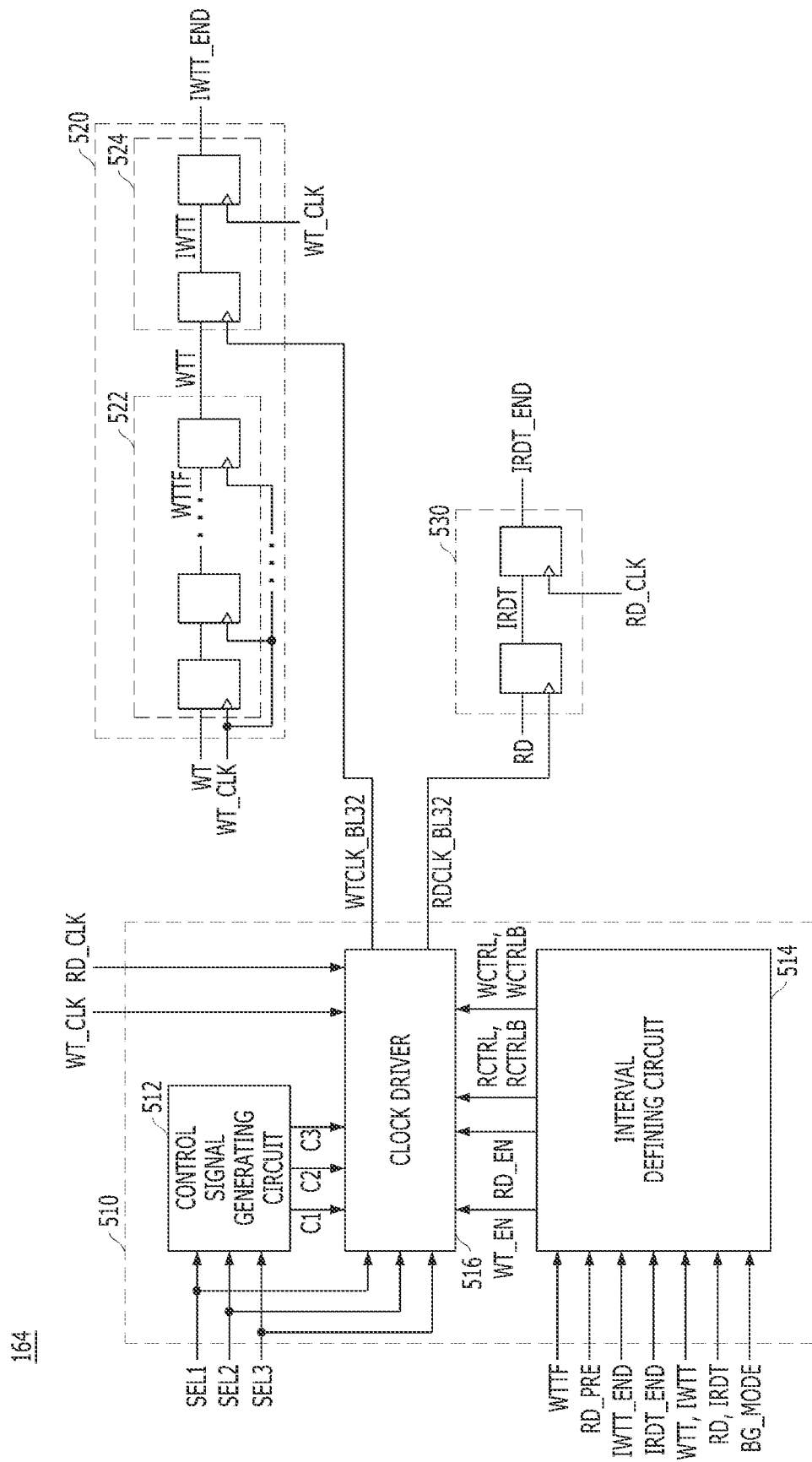
FIG. 13 is a detailed circuit diagram illustrating a latency setting circuit according to a third embodiment of the present invention.
Figure 14:
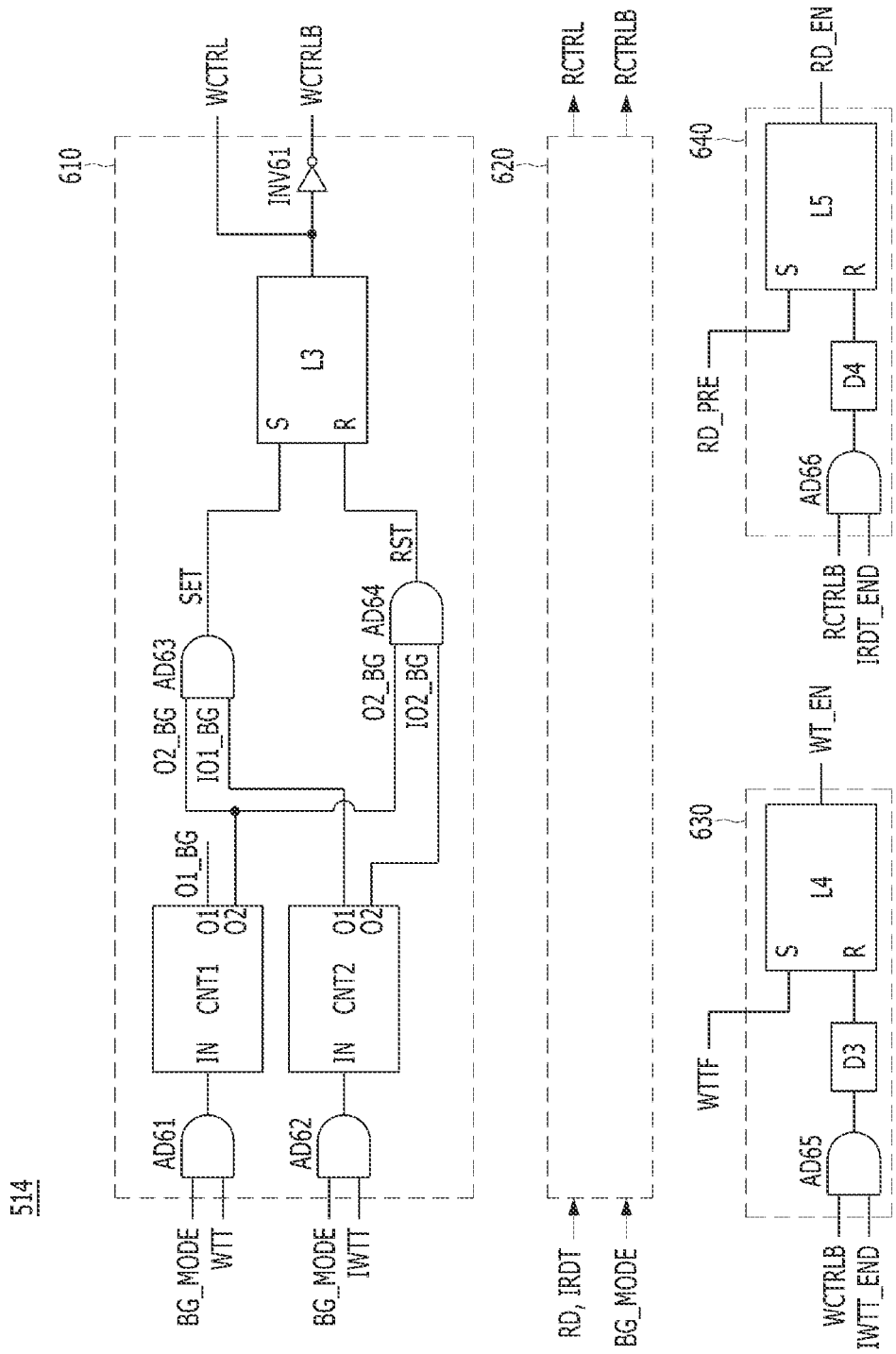
FIG. 14 is a circuit diagram illustrating an interval defining circuit, such as that illustrated in FIG. 13.
Figure 15:
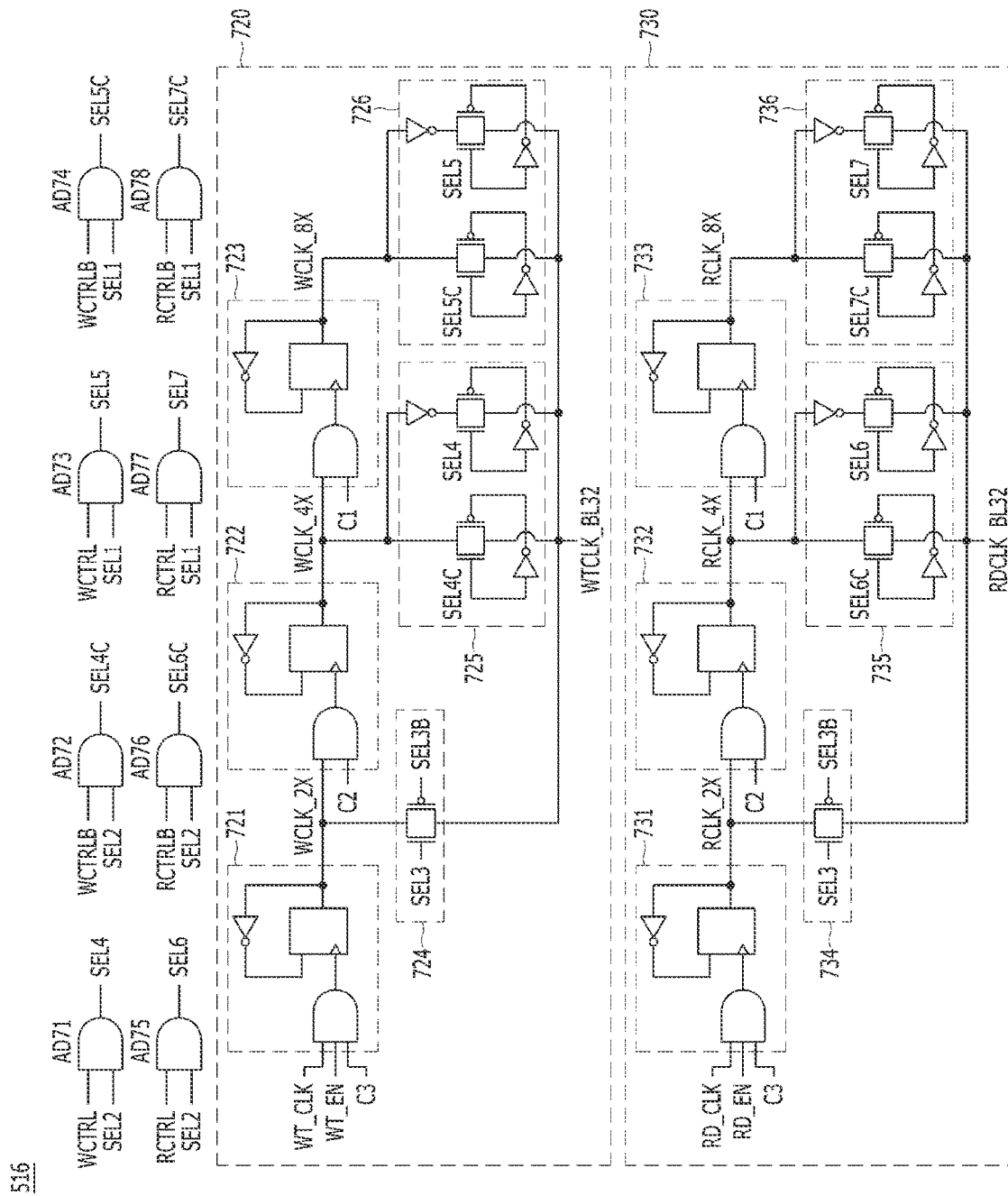
FIG. 15 is a circuit diagram illustrating a clock driver, such as that illustrated in FIG. 13.

FIG. 13 is a detailed circuit diagram illustrating the latency setting circuit 164 according to a third embodiment of the present invention. FIG. 14 is a circuit diagram illustrating an interval defining circuit 514 as illustrated in FIG. 13. FIG. 15 is a circuit diagram illustrating a clock driver 516 as illustrated in FIG. 13.

Referring to FIG. 13, the latency setting circuit 164 may include a dock driving circuit 510, a write latency circuit 520, and a read latency circuit 530. The write latency circuit 520 and read latency circuit 530 of FIG. 13 are substantially the same in circuit configuration as the write latency circuit 320 and the read latency circuit 330 of FIG. 7, respectively.

During a write operation in the bank group mode, the dock driving circuit 510 may delay the write clock WT_CLK by the latency corresponding to the activated mode selection signal among the first to third mode selection signals SEL1 to SEL3 to thereby generate a write trigger signal WTCLK_BL32. During a read operation in the bank group mode, the clock driving circuit 510 may delay the read clock RD_CLK by the latency corresponding to the activated mode selection signal among the first to third mode selection signals SEL1 to SEL3 to thereby generate a read trigger signal RDCLK_BL32. In this case, in the bank group mode, the clock driving circuit 510 may receive a bank group signal BG_MODE, a write start signal WTTF and a write end signal IWTT_END to define a write operation interval and, in the bank group mode, the clock driving circuit 510 may receive a bank group signal BG_MODE, a read start signal RD_PRE and a read end signal IRDT_END to define a read operation interval. In the third embodiment of the present invention, the clock driving circuit 510 may further receive the bank group signal BG_MODE to differentiate the bank group mode. The bank group signal BG_MODE is a signal activated when the second operation information MR3_OP<4:3> described above in connection with FIG. 3B is at the logic low level.

Specifically, the dock driving circuit 510 may include a control signal generating circuit 512, an interval defining circuit 514, and a clock driver 516.

The control signal generating circuit 512 may generate first to third control signals C1 to C3 based on which of the first to third mode selection signals SEL1 to SEL3 or combination thereof is activated. The control signal generating circuit 512 of FIG. 13 is substantially the same in configuration as the control signal generating circuit 312 of FIG. 7.

In the bank group mode, the interval defining circuit 514 may generate a write interval signal WT_EN to define a write operation interval, a read interval signal RD_EN to define a read operation interval, a first output control signal WCTRL to define a interval during which the internal write command IWTT is output, and a second output control signal RCTRL to define a interval during which the internal read command IRDT is output. The interval defining circuit 514 may receive the write start signal WTTF, the read start signal RD_PRE, the write end signal IWTT_END, the read end signal IRDT_END, the preliminary write command WTT, the internal write command IWTT, the read command RD, the internal read command IRDT, and the bank group signal BG_MODE, and generate the write interval signal WT_EN, the read interval signal RD_EN, the first and second output control signals WCTRL and RCTRL, and inverted first and second output control signals WCTRLB and RCTRLB.

For example, referring to FIG. 14, the interval defining circuit 514 may include a write output control circuit 610, a read output control circuit 620, a write interval circuit 630, and a read interval circuit 640.

In the bank group mode, the write output control circuit 610 may generate a first output control signal WCTRL that is activated after two consecutive preliminary write commands WTT are input and when the internal write command IWTT is first input and is deactivated when the internal write command IWTT is second input. The write output control circuit 610 may generate an inverted first output control signal WCTRLB by inverting the first output control signal WCTRL.

Specifically, the write output control circuit 610 may include first to fourth AND gates AD61 to AD64, first and second counters CNT1 and CNT2, a first SR latch L3, and a first inverter INV61. The first AND gate AD61 may perform a logic AND operation on the bank group signal BG_MODE and the preliminary write command WTT, and the second AND gate AD62 may perform a logic AND operation on the bank group signal BG_MODE and the internal write command IW When the output of the first AND gate AD61 is first activated, the first counter CNT1 may activate the first output signal O1_BG and, when the output of the first AND gate AD61 is second activated, the first counter CNT1 may deactivate the first output signal O1_BG and activate the second output signal O2_BG. When the output of the second AND gate AD62 is first activated, the second counter CNT2 may activate the third output signal IO1_BG and, when the output of the second AND gate AD62 is second activated, the second counter CNT2 may deactivate the third output signal IO1_BG and activate the fourth output signal IO2_BG. According to an embodiment, the first and second counters CNT1 and CNT2 may be reset when the write operation interval is terminated, i.e., when the write interval signal WT_EN is deactivated. The third AND gate AD63 may perform a logic AND operation on the second output signal O2_BG and the third output signal IO1_BG and output a set signal SET. The fourth AND gate AD64 may perform a logic AND operation on the second output signal O2_BG and the fourth output signal IO2_BG and output a reset signal RST. The first SR latch L3 may generate the first output control signal WCTRL which is set according to the set signal SET and is reset according to the reset signal RST. The first inverter INV61 may generate an inverted first output control signal WCTRLB by inverting the first output control signal WCTRL.

In the bank group mode, the read output control circuit 620 may generate a second output control signal RCTRL that is activated after two consecutive read commands RD are input and when the internal read command IRDT is first input and is deactivated when the internal read command IRDT is second input. The read output control circuit 620 may generate an inverted second output control signal RCTRLB by inverting the second output control signal RCTRL. The read output control circuit 620 has substantially the same configuration as the write output control circuit 610.

The write interval circuit 630 may generate the write interval signal WT_EN that is activated according to the write start signal WTTF and is deactivated when both the write end signal IWTT_END and the inverted first output control signal WCTRLB are activated. The write interval circuit 630 may include a fifth AND gate AD65, a first delay D3, and a second SR latch L4. The fifth AND gate AD65 may perform a logic AND operation on the write end signal IWTT_END and the inverted first output control signal WCTRLB. The first delay D3 may delay the output of the fifth AND gate AD65 a set time. The second SR latch L4 may generate the write interval signal WT_EN which is set according to the write start signal WI IF and is reset according to the output of the first delay D3. In other words, as compared with the write interval circuit 3142 according to the second embodiment, the write interval circuit 630 according to the third embodiment may generate the write interval signal WT_EN, in the bank group mode, that is activated according to the write start signal WTTF and is deactivated according to the write end signal IWTT_END after both the preliminary write command WTT and the internal write command IWTT are second activated.

The read interval circuit 640 may generate the read interval signal RD_EN that is activated according to the read start signal RD_PRE and is deactivated when both the read end signal IRDT_END and the inverted second output control signal RCTRLB are activated. The read interval circuit 640 may include a sixth AND gate AD66, a second delay D4, and a third SR latch L5. The read interval circuit 640 has substantially the same configuration as the write interval circuit 630. Likewise, as compared with the read interval circuit 3144 according to the second embodiment, the read interval circuit 640 according to the third embodiment may generate the read interval signal RD_EN, in the bank group mode, that is activated according to the read start signal RD_PRE and is deactivated according to the read end signal IRDT_END after both the read command RD and the internal read command IRDT are second activated.

Referring back to FIG. 13, the clock driver 516 may generate the write trigger signal WTCLK_BL32 and the read trigger signal RDCLK_BL32 according to the first and second output control signals WCTRL and RCTRL, the inverted first and second output control signals WCTRLB and RCTRLB, the write interval signal WT_EN, the read interval signal RD_EN, the first to third control signals C1 to C3, the first to third mode selection signals SEL1 to SEL3, the write clock WT_CLK, and the read clock RD_CLK. The clock driver 316 may generate first to third write division clocks WCLK_2X, WCLK_4X, and WCLK_8X by dividing the write clock WT_CLK by certain multiples, according to the first to third control signals C1 to C3 during the active interval of the write interval signal WT_EN. The dock driver 316 may output the write trigger signal WTCLK_BL32 by inverting or non-inverting one of the first to third write division docks WCLK_2X, WCLK_4X, and WCLK_8X according to the first to third mode selection signals SEL1 to SEL3, the first output control signal WCTRL, and the inverted first output control signal WCTRLB. Further, the dock driver 316 may generate first to third read division clocks RCLK_2X, RCLK_4X, and RCLK_8X by dividing the read clock RD_CLK by certain multiples, according to the first to third control signals C1 to C3 during the active interval of the read interval signal RD_EN. The clock driver 316 may output the read trigger signal RDCLK_BL32 by inverting or non-inverting one of the first to third read division clocks RCLK_2X, RCLK_4X, and RCLK_8X according to the first to third mode selection signals SEL1 to SEL3, the second output control signal RCTRL, and the inverted second output control signal RCTRLB.

For example, referring to FIG. 15, the clock driver 516 may include first to eighth AND gates AD71 to AD78, a write trigger circuit 720 and a read trigger circuit 730.

The first AND gate AD71 may perform a logic AND operation on the first output control signal WCTRL and the second mode selection signal SEL2 to thereby generate the fourth mode selection signal SEL4, and the second AND gate AD72 may perform a logic AND operation on the inverted first output control signal WCTRLB and the second mode selection signal SEL2 to thereby generate a complementary fourth mode selection signal SEL4C. The third AND gate AD73 may perform a logic AND operation on the first output control signal WCTRL and the first mode selection signal SEL1 to thereby generate the fifth mode selection signal SEL5, and the fourth AND gate AD74 may perform a logic AND operation on the inverted first output control signal WCTRLB and the first mode selection signal SEL1 to thereby generate a complementary fifth mode selection signal SEL5C. The fifth AND gate AD75 may perform a logic AND operation on the second output control signal RCTRL and the second mode selection signal SEL2 to thereby generate the sixth mode selection signal SEL6, and the sixth AND gate AD76 may perform a logic AND operation on the inverted second output control signal RCTRLB and the second mode selection signal SEL2 to thereby generate a complementary sixth mode selection signal SEL6C. The seventh AND gate AD77 may perform a logic AND operation on the second output control signal RCTRL and the first mode selection signal SEL1 to thereby generate the seventh mode selection signal SEL7, and the eighth AND gate AD78 may perform a logic AND operation on the inverted second output control signal RCTRLB and the first mode selection signal SEL1 to thereby generate a complementary seventh mode selection signal SEL7C.

As a result, when the first output control signal WCTRL is activated, the second mode selection signal SEL2 and the first mode selection signal SEL1, respectively, are output as the fourth mode selection signal SEL4 and the fifth mode selection signal SEL5. In contrast, when the first output control signal WCTRL is deactivated, the second mode selection signal SEL2 and the first mode selection signal SEL1, respectively, are output as the complementary fourth mode selection signal SEL4C and the complementary fifth mode selection signal SEL5C. Likewise, when the second output control signal RCTRL is activated, the second mode selection signal SEL2 and the first mode selection signal SEL1, respectively, are output as the sixth mode selection signal SEL6 and the seventh mode selection signal SEL7. In contrast, when the second output control signal RCTRL is deactivated, the second mode selection signal SEL2 and the first mode selection signal SEL1, respectively, are output as the complementary sixth mode selection signal SEL6C and the complementary seventh mode selection signal SEL7C.

The write trigger circuit 720 may generate first to third write division clocks WCLK_2X, WCLK_4X, and WCLK_8X by dividing the write clock WT_CLK by certain multiples, according to the first to third control signals C1 to C3 during the active interval of the write interval signal WT_EN. The write trigger circuit 720 may invert or non-invert one of the first to third write division clocks WCLK_2X, WCLK_4X, and WCLK_8X according to the third to fifth mode selection signals SEL3 to SEL5, and output the resultant signal as the write trigger signal WTCLK_BL32.

Specifically, the write trigger circuit 720 may include first to third dividing circuits 721 to 723 and first to third selecting circuits 724 to 726. The first to third dividing circuits 721 to 723 of FIG. 15 are configured substantially the same as the first to third dividing circuits 411 to 413 of FIG. 10, respectively. The first selecting circuit 724 may output the first write division clock WCLK_2X as the write trigger signal WTCLK_BL32 according to the third mode selection signal SEL3. The second selecting circuit 725 may output the second write division clock WCLK_4X as the write trigger signal WTCLK_BL32 according to the complementary fourth mode selection signal SEL4C or may invert the second write division clock WCLK_4X according to the fourth mode selection signal SEL4 and output the resultant signal as the write trigger signal WTCLK_BL32. The third selecting circuit 726 may output the third write division clock WCLK_8X as the write trigger signal WTCLK_BL32 according to the complementary fifth mode selection signal SEL5C or may invert the third write division clock WCLK_8X according to the fifth mode selection signal SEL5 and output the resultant signal as the write trigger signal WTCLK_BL32.

By the above-described configuration, the write trigger circuit 720 may invert the third write division clock WCTLK_8X generated by dividing, by 8, the frequency of the write clock WT_CLK and output the resultant signal as the write trigger signal WTCLK_BL32, when the first output control signal WCTRL and the first mode selection signal SEL1 are activated and, thus, the fifth mode selection signal SEL5 and the first to third control signals C1 to C3 are activated. In contrast, the write trigger circuit 720 may output the third write division dock WCLK_8X, which is generated by dividing, by 8, the frequency of the write dock WT_CLK, as it is, as the write trigger signal WTCLK_BL32, when the inverted first output control signal WCTRLB and the first mode selection signal SEL1 are activated and, thus, the complementary fifth mode selection signal SEL5C and the first to third control signals C1 to C3 are activated.

The read trigger circuit 730 may generate first to third read division clocks RCLK_2X, RCLK_4X, and RCLK_8X by dividing the read clock RD_CLK by certain multiples according to the first to third control signals C1 to C3, during the read operation defined according to the read interval signal RD_EN. The read trigger circuit 730 may invert or non-invert one of the first to third read division clocks RCLK_2X, RCLK_4X, and RCLK_8X, according to the third, sixth, and seventh mode selection signals SEL3, SEL6, and SEL7 and output the resultant signal as the read trigger signal RDCLK_BL32. The read trigger circuit 730 may include fourth to sixth dividing circuits 731 to 733 and fourth to sixth selecting circuits 734 to 736. Each component of the read trigger circuit 730 has substantially the same configuration as its counterpart component of the write trigger circuit 720, FIG. 16 is a timing diagram illustrating a write operation according to the third embodiment of the present invention.

Figure 16:
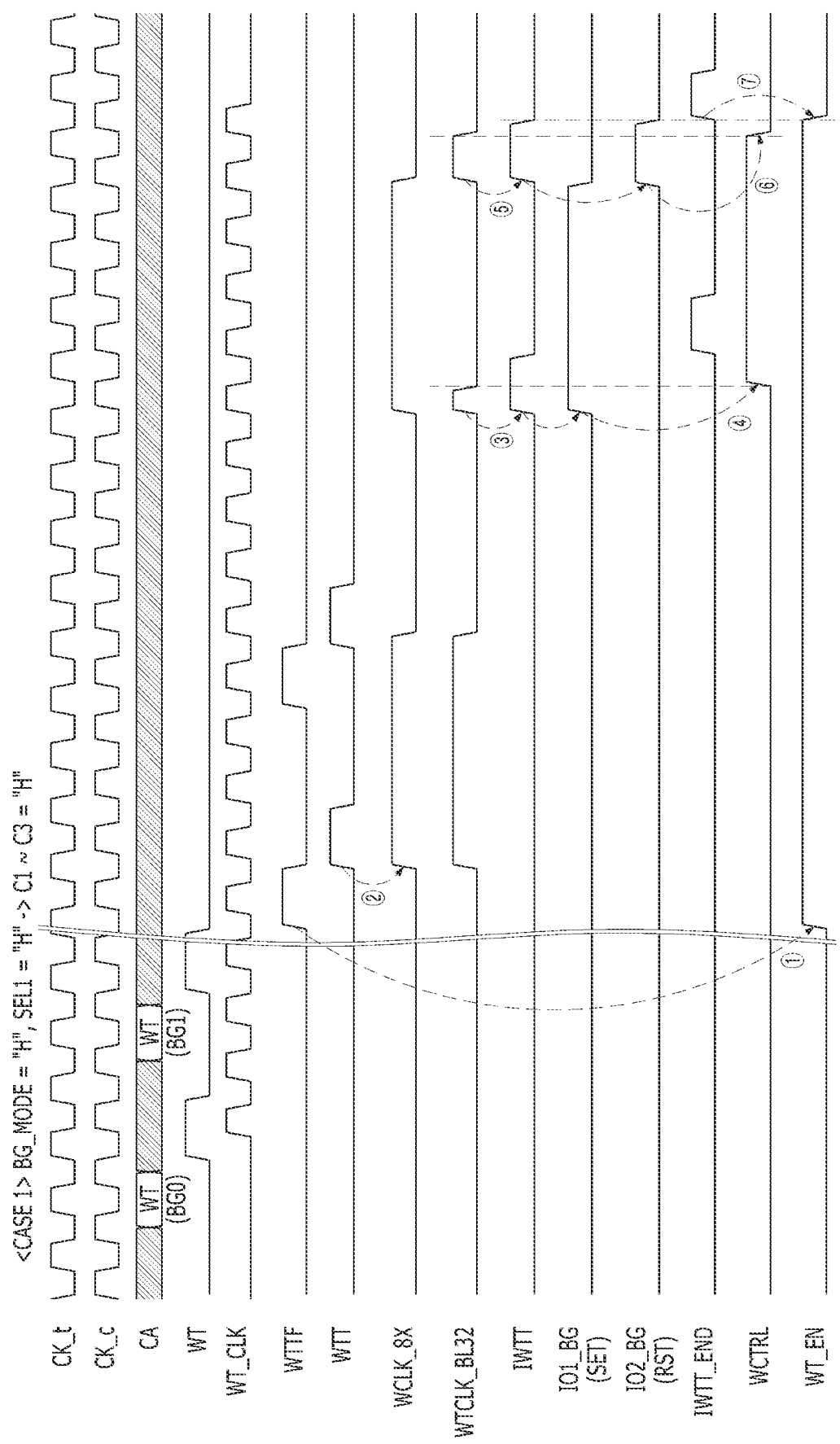
FIG. 16 is a timing diagram illustrating a write operation according to the third embodiment of the present invention.

FIG. 16 illustrates an example in which the first mode selection signal SEL1 is activated at the logic high level in CASE 1. The control signal generating circuit 512 may activate the first to third control signals C1 to C3 at the logic high level according to the first mode selection signal SELL The CA buffer 122 consecutively receives the command/addresses CA indicating the write operation for performing the BL 32 operation of the first bank group BG0 and the second bank group BG1 based on the system dock CK. The command decoder 123 consecutively generates the write commands WT by decoding the internal command ICMD output from the CA buffer 122. In the bank group mode, the two consecutive write commands WT may be input. The first dock buffer 121 may receive the system dock CK according to the first write command WT and output the write clock WT_CLK.

The preliminary latency circuit 522 may delay the consecutive write commands WT a set first latency ('WL+BL/N+1') according to the write dock WT_CLK, consecutively generating preliminary write commands WTT. In this case, the preliminary latency circuit 522 may output a signal activated one dock (CK) cycle earlier than the preliminary write command WTT as the write start signal WTTF.

The write interval circuit 630 of the interval defining circuit 514 activates the write interval signal WT_EN according to the first write start signal WTTF (①). When the write interval signal WT_EN is activated, with the first to third control signals C1 to C3 activated, the dock driver 516 sequentially divides, by 2, the frequency of the write clock WT_CLK, thereby generating the first to third write division docks WCLK_2X, WCLK_4X, and WCLK_8X. In this case, since the first output control signal WCTRL has been deactivated, the clock driver 516 may non-invert the third write division clock WCLK_8X according to the complementary fifth mode selection signal SEL5C and output the resultant signal as the write trigger signal WTCLK_BL32 (②).

The main latency circuit 524 may latch the preliminary write command WTT in response to a rising edge (③) of the write trigger signal WTCLK_BL32 and output the resultant signal as the first internal write command IWTT. When the two consecutive preliminary write commands WTT are input and the second output signal O2_BG is thus activated and, in this state, the first internal write command IWTT is input so that the third output signal IO1_BG is activated, the write output control circuit 610 of the interval defining circuit 514 may activate the set signal SET and may accordingly activate the first output control signal WCTRL (㊷). The main latency circuit 524 may latch the internal write command IWTT according to the write clock WT_CLK and output the resultant signal as the write end signal IWTT_END. However, since the first output control signal WCTRL is active, the write interval circuit 630 may maintain the active state of the write interval signal WT_EN.

Thereafter, since the first output control signal WCTRL has been activated, the clock driver 516 may invert the third write division clock WCLK_8X according to the fifth mode selection signal SEL5 and output the resultant signal as the write trigger signal WTCLK_BL32, The main latency circuit 524 may latch the preliminary write command WTT in response to a rising edge (⑤) of the write trigger signal WTCLK_BL32 and output the second internal write command IWTT. When the second internal write command IWTT is input so that the fourth output signal IO2_BG is activated, with the second output signal O2_BG activated, the write output control circuit 610 may activate the reset signal RST and may accordingly deactivate the first output control signal WCTRL. In this case, the main latency circuit 524 may latch the internal write command IWTT according to the write clock WT_CLIC to thereby output the write end signal IWTT_END, and the write interval circuit 630 may deactivate the write interval signal WT_EN in response to the second write end signal IWTT_END input, with the first output control signal WCTRL deactivated (⑦).

As set forth above, in the third embodiment of the present invention, in the bank group mode, two write commands WT may be consecutively input, supporting the BL 32 operation even when the timing margin is tight.

It should be noted that although embodiments of the present invention have been illustrated and described, the present invention is not limited to or by any of the disclosed embodiments. Those skilled in the art will recognize in light of the present disclosure that various changes may be made to any of the disclosed embodiments without departing from the technical spirit of the present invention. The present invention encompasses all changes that fall within the scope of the claims.

For example, the logic gates and transistors provided as examples herein, may be of a different type and arranged differently than disclosed herein depending on the polarity of the input signal.

What is claimed is:

1. A latency setting circuit, comprising:
   a clock driving circuit configured to delay a first operating clock by a latency corresponding to an activated one of a plurality of mode selection signals for setting different latencies to generate a first trigger signal, during a first operation; and
   a first latency circuit configured to delay a first operating command and latch the first operating command according to the first trigger signal provided from the clock driving circuit to output a first internal command.

2. The latency setting circuit of claim 1, wherein the first latency circuit includes:
   a preliminary latency circuit configured to generate a preliminary command by delaying the first operating command by a set latency according to the first operating clock; and
   a main latency circuit configured to latch the preliminary command according to the first trigger signal to output the first internal command.

3. The latency setting circuit of claim 2,
   wherein the preliminary latency circuit includes:
   a plurality of flip-flops connected in series, and configured to output the preliminary command by sequentially shifting the first operating command according to the first operating clock, and
   wherein a last flip-flop of the plurality of flip-flops receives, as a start signal, an output of a previous flip-flop and outputs the preliminary command.

4. The latency setting circuit of claim 2, wherein the main latency circuit includes:
   a first flip-flop configured to latch the preliminary command in synchronization with the first trigger signal to output the first internal command; and
   a second flip-flop configured to latch the first internal command in synchronization with the first operating clock to output a first end signal.

5. The latency setting circuit of claim 2, wherein the clock driving circuit includes:
- a control signal generating circuit configured to generate a plurality of control signals based on the plurality of mode selection signals;
- an interval defining circuit configured to generate an interval signal for defining a first operation interval and a first output control signal for defining an interval during which the first internal command is output, in a group mode; and
- a clock driver configured to generate a plurality of division clocks by dividing the first operating clock by certain multiples, and output the first trigger signal by inverting or non-inverting one of the division clocks according to the mode selection signals and the first output control signal, during an active interval of the interval signal.

6. The latency setting circuit of claim 5, wherein the interval defining circuit includes:
- an output control circuit configured to generate the first output control signal activated when the first internal command is first input after two consecutive first operating commands are input and deactivated when the first internal command is second input, in the group mode; and
- an interval circuit configured to generate the interval signal activated according to a start signal and deactivated according to a first end signal and the first output control signal.

7. The latency setting circuit of claim 5, wherein the clock driver includes:
- a plurality of dividing circuits respectively corresponding to the control signals and connected in series, configured to generate the division clocks by sequentially dividing the first operating clock when their corresponding signals are activated; and
- a plurality of selecting circuits suitable for respectively corresponding to the dividing circuits, configured to select one of the division clocks according to the activated mode selection signal and the first output control signal, and output the first trigger signal by inverting or non-inverting the selected division clock.

8. The latency setting circuit of claim 1, wherein the clock driving circuit is further configured to delay a second operating clock by the latency to generate a second trigger signal, during a second operation.

9. The latency setting circuit of claim 1, further comprising: a second latency circuit configured to latch a second operating command according to the second trigger signal to output a second internal command.

10. The latency setting circuit of claim 9, wherein the second latency circuit includes:
- a third flip-flop configured to latch the second operating command in synchronization with the second trigger signal to output the second internal command; and
- a fourth flip-flop configured to latch the second internal command in synchronization with the second operating clock to output a second end signal.

11. The latency setting circuit of claim 1, wherein the clock driving circuit includes:
- a control signal generating circuit configured to generate a plurality of control signals based on the plurality of mode selection signals;
- an interval defining circuit configured to generate an interval signal for defining a first operation interval; and
- a clock driver configured to generate a plurality of division clocks by dividing the first operating clock by certain multiples, and output one of the division clocks as the first trigger signal according to the mode selection signals, during an active interval of the interval signal.

12. The latency setting circuit of claim 11, wherein the control signal generating circuit generates the plurality of control signals by:
- activating a third control signal when any one of first to third mode selection signals is activated,
- activating a second control signal when the first mode selection signal or the second mode selection signal is activated, and
- activating a first control signal when the first mode selection signal is activated.

13. The latency setting circuit of claim 11, wherein the interval defining circuit includes: a first SR latch configured to generate the interval signal activated according to a start signal and deactivated according to a delay signal of a first end signal.

14. The latency setting circuit of claim 11, wherein the clock driver includes:
- a plurality of dividing circuits respectively corresponding to the control signals, connected in series, and configured to generate the division clocks by sequentially dividing the first operating clock when their corresponding signals are activated; and
- a plurality of selecting circuits respectively corresponding to the dividing circuits and configured to select one of the division clocks according to the activated mode selection signal and outputting output the selected division clock as the first trigger signal.

15. A latency setting circuit, comprising:
- a control signal generating circuit configured to generate first to third control signals based on first to third mode selection signals for setting different latencies;
- a first trigger circuit configured to generate first to third division clocks by dividing a first operating clock by certain multiples according to the first to third control signals, and output one of the first to third division clocks as a first trigger signal according to the first to third mode selection signals, during a first operation interval;
- a second trigger circuit configured to generate fourth to sixth division clocks by dividing a second operating clock by certain multiples according to the first to third control signals, and output one of the fourth to sixth division clocks as a second trigger signal according to the first to third mode selection signals, during a second operation interval;
- a first latency circuit configured to latch a first operating command according to the first trigger signal and output a first internal command; and
- a second latency circuit configured to latch a second operating command according to the second trigger signal and output a second internal command.

16. The latency setting circuit of claim 15,
wherein the first operation interval includes a section where a write operation is performed, and the first operating command includes a write command, and
wherein the second operation interval includes a section where a read operation is performed, and the second operating command includes a read command.

* * * * *